(12) United States Patent
Barabash et al.

(10) Patent No.: US 9,019,744 B2
(45) Date of Patent: Apr. 28, 2015

(54) BARRIER DESIGN FOR STEERING ELEMENTS

(71) Applicant: Intermolecular, Inc., San Jose, CA (US)

(72) Inventors: Sergey Barabash, San Jose, CA (US); Mankoo Lee, Fremont, CA (US); Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 280 days.

(21) Appl. No.: 13/728,739

(22) Filed: Dec. 27, 2012

(65) Prior Publication Data

US 2014/0185357 A1   Jul. 3, 2014

(51) Int. Cl.
*H01L 45/00*    (2006.01)
*G11C 13/00*    (2006.01)
*H01L 27/24*    (2006.01)

(52) U.S. Cl.
CPC .......... *H01L 45/147* (2013.01); *G11C 13/0002* (2013.01); *G11C 13/003* (2013.01); *G11C 2213/76* (2013.01); *H01L 45/08* (2013.01); *H01L 45/1266* (2013.01); *H01L 45/1633* (2013.01); *H01L 27/2463* (2013.01)

(58) Field of Classification Search
CPC ....... H01L 45/04; H01L 45/08; H01L 45/085; H01L 45/14; H01L 45/145–45/147; G11C 13/0011; G11C 13/003
USPC ................. 257/2–5, 191, 475, 657, 257/E45.001–E45.003; 365/148
See application file for complete search history.

(56) References Cited

U.S. PATENT DOCUMENTS

| | | | | |
|---|---|---|---|---|
| 5,019,530 A | * | 5/1991 | Kleinsasser et al. | 438/572 |
| 5,291,274 A | * | 3/1994 | Tamura | 257/30 |
| 6,121,654 A | * | 9/2000 | Likharev | 257/315 |
| 6,677,220 B2 | | 1/2004 | Van Brocklin et al. | |
| 7,843,715 B2 | | 11/2010 | Park et al. | |
| 7,875,871 B2 | | 1/2011 | Kumar et al. | |
| 8,178,864 B2 | * | 5/2012 | Jin et al. | 257/30 |
| 2007/0284646 A1 | * | 12/2007 | Kikuchi et al. | 257/315 |
| 2010/0193760 A1 | * | 8/2010 | Takagi et al. | 257/3 |

OTHER PUBLICATIONS

Kau, D., et al.; A Stackable Cross Point Phase Change Memory; 2009; IEEE; pp. 27.1.1-27.1.4.

(Continued)

*Primary Examiner* — Allison P Bernstein

(57) ABSTRACT

Steering elements suitable for memory device applications can have low leakage currents at low voltages to reduce sneak current paths for non selected devices, and high leakage currents at high voltages to minimize voltage drops during device switching. In some embodiments, the steering element can include a first electrode, a second electrode, and a graded dielectric layer sandwiched between the two electrodes. The graded dielectric layer can include a varied composition from the first electrode to the second electrode. Graded energy level at the top and/or at the bottom of the band gap, which can be a result of the graded dielectric layer composition, and/or the work function of the electrodes can be configured to suppress tunneling and thermionic current in an off-state of the steering element and/or to maximize a ratio of the tunneling and thermionic currents in an on-state and in an off-state of the steering element.

15 Claims, 20 Drawing Sheets

(56) References Cited

OTHER PUBLICATIONS

Kim, H.; Atomic Layer Depositon of Metal and Nitrade Thin Films: Current Research Efforts and Applications for Semiconductor Device Processing; Nov. 3, 2003; American Vacuum Society; Journal of Vacuum Science & Technology B, vol. 21, No. 6; pp. 2231-2261.

Lee, W., et al.; Varistor-type Bidirectional Switch (JMAX>107 A/cm2, Selectivity~104) for 3D Bipolar Resistive Memory Arrays; 2012; IEEE; 2012 Symposium on VLSI Technology Digest of Technical Papers; pp. 37-38.

* cited by examiner

Initial Forming

Operational Switching

BARRIER DESIGN FOR STEERING ELEMENTS

FIELD OF THE INVENTION

This invention relates generally to nonvolatile memory elements, and more particularly, to methods for forming resistive switching memory elements used in nonvolatile memory devices.

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive memory device, e.g., resistive switching nonvolatile random access memory (ReRAM) is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, the resistance of these films and the ratio of the high-to-low resistance states are often insufficient to be of use within a practical nonvolatile memory device. For instance, the resistance states of the metal oxide film should preferably be significant as compared to that of the system (e.g., the memory device and associated circuitry) so that any change in the resistance state change is perceptible. The variation of the difference in resistive states is related to the resistance of the resistive switching layer. Therefore, a low resistance metal oxide film may not form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. Therefore, the state of the bistable metal oxide resistive switching element may be difficult or impossible to sense. Furthermore, the parasitic resistance (or the parasitic impedance, in the actual case of time-dependent operation), e.g. due to sneak current paths that exist in the system, may depend on the state of the system, such as the data stored in other memory cells. It is often preferable that the possible variations of the parasitic impedance be unsubstantial compared to the difference in the values of the high and low resistance of a memory cell.

Similar issues can arise from integration of the resistive switching memory element with current selector elements (or current limiter or current steering element), such as diodes and/or transistors. Selector devices in nonvolatile memory structures can screen the memory elements from sneak current paths to ensure that only the selected bits are read or programmed. Schottky diode can be used as a selector device, which can include p-n junction diode or metal-semiconductor diode, however, this requires high thermal budget that may not be acceptable for 3D memory application. Metal-Insulator-Metal Capacitor (MIMCAP) tunneling diodes may have a challenge of getting controllable low barrier height and low series resistance. In some embodiments, the selector device can also function as a current limiter or steering element. In some embodiments, a current limiter, and/or a steering element, can be formed separately from the selector device. In some embodiments, a current limiter can suppress too large currents without affecting acceptable operation currents in a memory device. In some embodiments, a steering element can suppress too small currents without affecting acceptable operation currents in a memory device. For example, a steering element can be used with the purpose of increasing the ratio of the measured resistances in the high and low resistance state, further making the non-volatile memory device less susceptible to the noise due to parasitic impedances in the system. Note that the terms "current selector", "current limiter", and "steering element" may often times be substituted for each other, due to a substantial overlap in the functional utility of the elements they may describe. Such a substitution does not affect the scope of this description, which is limited only by the claims.

Therefore, there is a need for a steering element that can meet the design criteria for advanced memory devices.

SUMMARY

In some embodiments, the present invention discloses a steering element that can be suitable for memory device applications. The steering element can have low leakage currents at low voltages to reduce sneak current paths for non selected devices, and high leakage currents at high voltages to minimize voltage drops during device switching. The steering element can be based on tunneling and/or thermionic conduction in the on-state for selected devices with high on-state currents, and high selectivity, e.g., the ratio of on-current to off-current, between the on-state and the off-state.

In some embodiments, the steering element can include a first electrode, a second electrode, and a graded dielectric layer sandwiched between the two electrodes. The graded dielectric layer can include a varied composition from the first electrode to the second electrode. In some embodiments, the composition of the graded dielectric layer is varied to form a sloped electron energy level at the top (and/or at the bottom) of the band gap of the dielectric layer between the first and second electrodes. For example, the electron energy level of the graded dielectric layer can increase, e.g., stepwise increasing or gradually increasing, along the direction between the two electrodes.

In some embodiments, the graded dielectric layer can include two oppositely graded layers. For example, the graded dielectric layer can be graded positively from the first electrode to a point between the first electrode and the second electrode. The graded dielectric layer is then graded negatively in the remaining distance, e.g., from the point to the second electrode. The electron energy level at the top (and/or at the bottom) of the band gap of the graded dielectric layer can correspond to the graded property, increasing from the first electrode to the point, and then decreasing from the point to the second electrode.

In some embodiments, the graded dielectric layer can include at least two elements, for example, an alloy of two elements or an oxide alloy of the two elements and oxygen. The ratio of the two elements can be varies to form the graded dielectric layer. For example, the dielectric layer can include $Ta_xTi_yO_z$, and x and y can inversely varied, e.g., x can increase and y can decrease at approximately the same rate, to form a graded dielectric layer. The dielectric layer can include $(SrTi)_x (BaZr)_{1-x}O_3$, and x can varies from 1 near the first electrode to 0 at the second electrode or at the point between the first and second electrode.

In some embodiments, the graded energy level at the top (and/or at the bottom) of the band gap of the graded dielectric, which can be a result of the graded dielectric layer composition, and/or the work function of the electrodes can be configured to suppress tunneling and thermionic current in an off-state of the steering element and/or to maximize a ratio of the tunneling and thermionic currents in an on-state and in an off-state of the steering element. In some embodiments, the graded electron energy level and the work function can be configured to provide changes in the tunneling path of the dielectric layer. For example, at an off-state voltage, which corresponds to an off-state of the steering element, the electron energy level at the top of the band gap can be substantially higher the Fermi levels in either electrode, so that the tunneling path of the graded dielectric layer can be similar to the thickness of the dielectric layer. Increasing the applied voltage can lower the energy level, resulting in a shorter tunneling path that can originate at the Fermi level of one of the electrodes and end at the energy level at the top of the band gap. The shortening of the tunneling path can effectively increase the tunneling current between the electrodes. In some embodiments, the graded energy level and the work function can be configured to provide changes in the thermionic current across the dielectric layer. For example, at an off-state voltage, which corresponds to an off-state of the steering element, the energy level at the top of the band gap can be substantially higher the Fermi levels in either electrode, so that the barrier for thermionic excitations is high. Increasing the applied voltage can lower the energy level, decreasing the barrier for thermionic excitations, effectively increasing the thermionic current between the electrodes.

In some embodiments, the present invention discloses methods to form steering elements, including forming a graded dielectric layer between two electrodes. The graded dielectric layer can have a graded composition, providing an electron graded energy level, which can be configured to suppress tunneling and thermionic current in an off-state of the steering element and/or to maximize a ratio of the tunneling and thermionic currents in an on-state and in an off-state of the steering element.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1A:
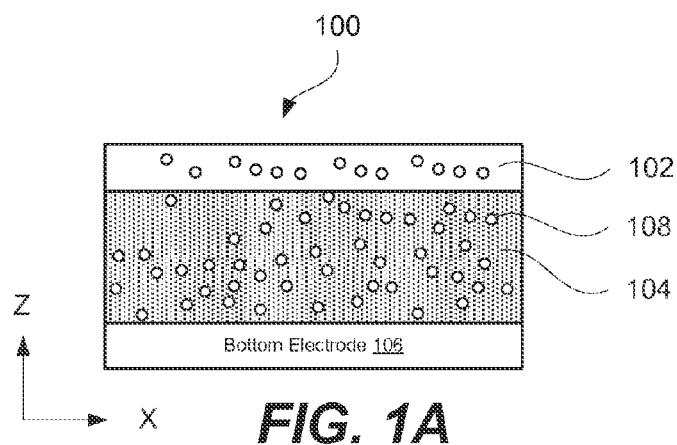
FIGS. 1A-1C illustrate a schematic representation of a ReRAM operation according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

A cross-bar architecture is promising for future non-volatile memories such as phase change memory (PCM) or resistive random access memory (ReRAM) because of the small cell size of 4F² achievable with each cell at the intersections of perpendicular word lines and bit lines, and the potential to stack multiple layers to achieve very high memory density. Two key challenges for the cross bar architecture are the possibility of current sneak-through paths (e.g., when trying to read a cell in high resistance state adjacent to cells in low resistance state) and the need to avoid unselected cell modification when half of the switching voltage is applied to the selected cell In some embodiments, current selectors or current steering devices are provided with a non-linear current-voltage (I-V) behavior, including low current at low voltages and high current at higher voltages. Unipolar selector can be appropriate for a unipolar memory such as PCM whereas bipolar selector can be more appropriate for a bipolar memory such as ReRAM and spin transfer torque random access memory (STT-RAM). The unipolar selector can have high resistance in reverse polarity. Both the unipolar and the bipolar selectors can have high resistance at low voltages. These selectors can prevent sneak-through current even when adjacent memory elements are in low-resistance state. Furthermore, the non-linear I-V can also provide the current selector with low resistance at higher voltages so that there is no significant voltage drop across the current selector during switching.

In some embodiments, current selectors requiring low temperature processing (e.g., <650 C) are provided, which can be suitable for emerging non-volatile memory architectures such as PCM and STT-RAM. In addition, the current selectors can include fab-friendly materials and can still exhibit a desired device performance.

In some embodiments, electrode-dielectric-electrode stacks are provided as unipolar or bipolar current selectors with low leakage at low voltages and high leakage at high voltages. For example, the dielectric layer can have a graded band gap, e.g., a band gap having graded electron energy level, so that at low applied voltages, the effective thickness of the dielectric layer, accounted for the band bending effect due to the applied voltage, can remain large enough to prevent high tunneling or thermionic current. The graded band gap can be further configured so that at low applied voltages, the effective thickness of the dielectric layer can be adequate to allow high tunneling or thermionic current.

In some embodiments, the dielectric layer can have graded composition, which can result in graded energy band gap in the dielectric layer. For example, a dielectric layer including $(SrTi)_x(BaZr)_{1-x}O_3$ can be graded to have the composition linearly varied from x=0.8 to 1 near the electrodes to x=0 to 0.2 near the center of the dielectric layer. Other materials and composition profiles can be used, such as low x value at any point within the dielectric layer (e.g., not necessarily near the center of the dielectric layer), non-linear composition profiles, or flat composition profiles at an interior region of the dielectric layer.

In some embodiments, symmetrical and asymmetrical current selectors can be provided as bipolar and unipolar current steering elements, respectively. For example, in asymmetrical current selectors, one electrode interface can have a high barrier height (e.g., TiN—$ZrO_2$ or Pt—$TiO_2$) and the other electrode interface can be ohmic. Alternatively, asymmetrical current selectors can include addition of bulk or interfacial defects which can allow tunneling through the Schottky barrier.

A ReRAM cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers may include metals and/or other conductive materials. The stack also includes an insulator layer disposed in between the electrode. The insulator layer exhibits resistive switching properties characterized by different resistive states of the material forming this layer. As such, this insulator layer is often referred to as a resistive switching layer. These resistive states may be used to represent one or more bits of information. The resistance switching properties of the insulator layer are believed to depend on various defects' presence and distribution inside this layer. For example, different distribution of oxygen vacancies in the layer may reflect different resistance states of the layer, and these states may be sufficiently stable for memory application.

To achieve a certain concentration of defects in the resistance switching layer, the layer has been conventionally deposited with defects already present in the layer, i.e., with preformed defects. In other words, defects are introduced into the layer during its formation. For example, tightly controlled Atomic Layer Deposition (ALD), Physical Vapor Deposition (PVD), or some other low-temperature process to remain within a Back End of Line (BEOL) thermal budget may be used to deposit the insulator layer of the stack. It may be difficult to precisely and repeatedly control formation of these defects particularly in very thin resistance switching layers (e.g., less than 100 Angstroms). For example, when ALD is used to form resistance switching layers, some unreacted precursors may leave carbon-containing residues that impact resistance characteristics of the deposition layers and ReRAM cells including these layers. Furthermore, achieving precise partial saturation repeatedly may be very difficult if possible at all. In the case of PVD, sputtering targets tend to wear out influencing the deposition rates and creating variation in resulting resistance switching layers.

Methods of forming nonvolatile memory elements can involve transferring oxygen from precursor layers (used to form or, more specifically, converted into resistance switching layers) to electrodes during annealing of the stacks. The annealing environment may include some hydrogen to control distribution of oxygen within the annealed structure.

As stated above, oxygen diffusion from the precursor layer into the electrode converts the precursor layer into a resistance switching layer. The precursor layer may include a stoichiometric oxide or near-stoichiometric oxide that cannot function as a resistance switching layer until oxygen vacancies or some other defects are formed within that layer. The metal of this oxide may be more electronegative than the metal of the electrode used to trap the oxygen diffused out of the precursor level. The electrode may have substantially no oxygen at least prior to the oxygen transfer but may form an oxide during annealing.

The stack may have a reactive electrode that receives some oxygen during annealing and an inert electrode that generally does not participate in oxygen transfer. The inert electrode may be referred to as an oxygen-resistant electrode and may be made from titanium nitride, tantalum nitride, platinum, gold, and the like. Other suitable materials for inert electrodes include various conductive oxide, such as iridium oxide and ruthenium oxide. In some embodiments, the inert electrode includes an oxide sub-layer facing the resistance switching layer. The rest of the electrode may be formed by the metal of this oxide and may be generally free of oxygen. For example, an initial structure may be fabricated from a metal and then pretreated to form an oxide layer resulting in an inert electrode. This electrode then receives a precursor layer and another reactive electrode formed over the precursor layer. During subsequent annealing, the inert electrode does not experience any significant oxygen transfer, while the reactive electrode receives oxygen from the precursor layer that is converted into the resistive switching oxide layer as it loses oxygen.

If an inert electrode with a protective oxide layer is a first formed electrode in the stack (i.e., the bottom electrode), then it can be first deposited as a metal layer followed by a short low-temperature anneal in oxygen. On the other hand, if an inert electrode is the last electrode formed in the stack (i.e., the top electrode), then its deposition can be initiated in the oxygen environment (e.g., sputtering in an oxygen-containing plasma) to form an initial oxide sub-layer followed by deposition in an inert environment to form the remaining metal (and oxygen free) portion of the electrode.

A reactive electrode can be made from a material that reacts with oxygen to form a non-conductive oxide. Some examples of suitable materials include aluminum, titanium, tantalum, chromium, praseodymium, molybdenum, tungsten, and niobium.

A precursor layer may be made from materials, such as tantalum oxide ($Ta_2O_5$), niobium oxide ($Nb_2O_5$), titanium oxide ($TiO_2$), hafnium oxide ($HfO_2$), strontium titanate ($SrTiO_3$), or other suitable transition metal oxides, perovskite manganites, or rare earth oxides. The precursor layer may include a stoichiometric oxide or near-stoichiometric oxide. For example, oxygen vacancies in the precursor layer may have a concentration of less than 0.1 atomic percent prior to its annealing.

Annealing may be performed on a fully formed stack including two electrodes and precursor layer or a partially formed stack that includes only one electrode (the second electrode is formed after the annealing). Other types of layers may also be present in these stacks. As stated above, annealing performed at relatively mild conditions to achieve better control over oxygen diffusion between one or more reactive layers and precursor layer. Annealing may form a graded composition of oxygen vacancies in the precursor layer.

The resistive switching layer changes its resistive state when a certain switching voltage (e.g., a set voltage or a reset voltage) is applied to this layer as further explained below. The applied voltage causes localized heating within the layer and/or at one of both of its interfaces with other components. Without being restricted to any particular theory, it is believed that a combination of the electrical field and localized heating (both created by the applied voltage) causes formation and breakage of various conductive paths within the resistive switching layer and/or at its interfaces. These conductive paths may be established and broken by moving defects (e.g., oxygen vacancies) within the resistive switching layer and through one or more interfaces that resistive switching layer forms with adjacent layers.

The interfaces can be inert interfaces or reactive interfaces. The inert interface generally does not have any substantial defect transfer through this interface. While the defects may be present within one or both layers forming this interface, these defects are not exchanged through the inert interface when switching, reading, or other types of voltages are applied to the ReRAM cell. The reactive interface generally experiences a transfer of defects through this interface. When a resistive switching layer includes an oxygen containing material, such as metal oxides, the reactive interface is formed by an oxygen reactive material, such as titanium. The inert interface may be formed by a material that is not oxygen reactive, which may be a part of an electrode or a diffusion barrier layer. In some embodiments, the flux of defects through the reactive interface is at two or more orders of magnitude greater than the flux of defects through the inert interface. As such, the "inert" and "reactive" naming convention is relative.

The inert interface provides a control for the resistive switching layer while defects are moved in and out of the resistive switching layer through the reactive interface. For example, when a switching voltage is applied to the resistive switching layer in order to reduce its resistance, the reactive interface allows defects to flow into the layer. The defects are typically driven by the electrical potential applied to the layer and form conductive paths through the layer. The direction of this flow may be determined by the polarity of the switching voltage and/or by the electrical charge of the defects (e.g., positive charged oxygen vacancies). At the same time, the second inert interface prevents defects from escaping the layer despite the driving potential. If both interfaces are reactive and allow defects to pass through, then the resistive switching layer may gain defects at one interface and loose at another. In this situation, the layer may never be able to gain enough defects to form conductive paths.

The above scenario is applicable in a very similar manner to a resetting operation during which the resistive switching layer is brought to its high resistance state. When a switching voltage is applied to the layer in order to increase its resistance of the layer, the reactive interface allows defects to flow out of the layer. The defects may also be driven by the electrical potential applied to the layer as described above. The loss of defects may eventually break conductive paths in the layer. At the same time, the second inert interface prevents defects from entering the layer despite the driving potential. If both interfaces are reactive and allow defects to pass through during the resetting operation, then the resistive switching layer may gain defects at one interface and loose at another. In this situation, the layer may never be able to lose enough defects in order to break it conductive paths. It should be noted that defects are often mobile in many times of resistive switching materials.

The ability of an interface to block defects (as in the inert interface) or to allow defects to diffuse through the interface (as in the reactive interface) depends on properties of a layer forming this interface together with the resistive switching layer. Often conductive electrodes are used to form both reactive and inert interfaces. These electrodes may be referred to as reactive and inert electrodes and materials used to form these electrodes may be referred to as reactive and inert materials. It should be noted that this terminology (i.e., reactive and inert) refers to primarily to defect mobility properties of the interfaces. Some examples of inert electrode materials include doped polysilicon, platinum, ruthenium, ruthenium oxide, gold, iridium, coppers, silver, and tungsten. Examples of reactive electrode materials include titanium. Furthermore, some materials may be defined as semi-inert including tantalum nitride, tantalum silicon nitride, and tungsten silicon nitride. In the context of oxygen containing resistive switching materials, such as metal oxides, reactive materials may be also referred to as oxygen reaction materials since oxygen or oxygen vacancies are exchanged through the reactive interface. Titanium is one example of oxygen reactive materials, however other examples may be used as well.

A brief description of ReRAM cells and their switching mechanisms are provided for better understanding of various features and structures associated with methods of forming nonvolatile memory elements further described below. ReRAM is a non-volatile memory type that includes dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 1B:
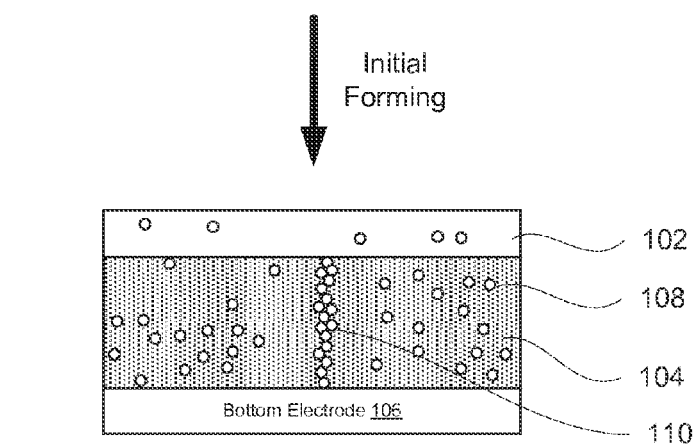
Figure 1C:
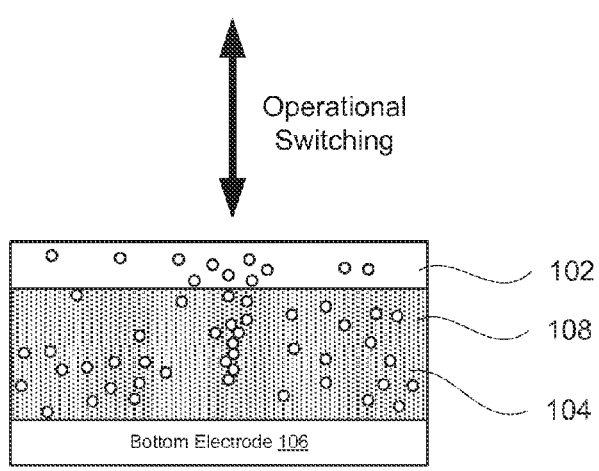

FIGS. 1A-1C illustrate a schematic representation of a ReRAM operation according to some embodiments. A basic building unit of a memory device is a stack having a capacitor like structure. A ReRAM cell includes two electrodes and a dielectric positioned in between these two electrodes. FIG. 1A illustrates a schematic representation of ReRAM cell 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

Top electrode 102 and bottom electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface). The other interface of the resistive switching layer may be inert and may be formed with an inert electrode or a diffusion barrier layer.

Resistance switching layer 104 which may be initially formed from a dielectric material and later can be made to conduct through one or more conductive paths formed within the layer by applying first a forming voltage and then a switching voltage. To provide this resistive switching functionality, resistance switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

In some embodiments, these defects may be utilized for ReRAM cells operating according to a valence change mechanism, which may occur in specific transition metal oxides, nitrides, and oxy-nitrides. For example, defects may be oxygen vacancies triggered by migration of oxygen anions. Migrations of oxygen anions correspond to the motion of corresponding oxygen vacancies that are used to create and break conductive paths. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature. Some of these mechanisms will be further described below with reference to FIGS. 1A-1C. In the described examples, top electrode 102 is reactive, while bottom electrode 106 is inert or is separated from resistive switching layer 104 by a diffusion barrier layer (not shown). One having ordinary skills in the art would understand that other arrangements are possible as well and within the scope of this disclosure.

Specifically, FIG. 1A is a schematic representation of ReRAM cell 100 prior to initial formation of conductive paths, in accordance with some embodiments. Resistive switching layer 104 may include some defects 108. Additional defects 108 may be provided within top electrode 102 and may be later transferred to resistive switching layer 104 during the formation operation. In some embodiments, the resistive switching layer 104 has substantially no defects prior to the forming operation and all defects are provided from top electrode 102 during forming. Bottom electrode 106 may or may not have any defects. It should be noted that regardless of the presence or absence of defects in bottom electrode 106, substantially no defects are exchanged between bottom electrode 106 and resistive switching layer 104 during forming and/or switching operations.

During the forming operation, ReRAM cell 100 can change its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistance switching layer 104 to form these conductive paths 110 as, for example, schematically shown in FIG. 1B. Furthermore, some or all defects 108 forming the conductive paths may enter resistive switching layer 104 from top electrode 102. For simplicity, all these phenomena are collectively referred to as reorientation of defects within ReRAM cell 100. This reorientation of defects 108 occurs when a certain forming voltage 104 is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Resistive switching involves breaking and reforming conductive paths through resistive switching layer 104, for example switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or re-formed. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into top electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and top electrode 102, the conductive paths may break closer to the interface with bottom electrode 106, somewhere within resistive switching layer 104, or at the interface with top electrode 102. This breakage generally does not correspond to complete dispersion of defects forming these conductive paths and may be a self limiting process, i.e., the process may stop after some initial breakage occurs.

When switching from its HRS to LRS, which is often referred to as a set operation, resistive switching layer 104 may receive some defects from top electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 104 during the set operation has the same polarity as a voltage applied during the reset operation. This type of switching is referred to as unipolar switching. Some examples of cells that exhibit unipolar switching behavior include resistive switching layers formed from most metal oxide and having inert electrodes at both sides, e.g., Pt/MeO$_x$/Pt. Alternatively, a voltage applied to electrodes 102 and 104 during the set operation may have different polarity as a voltage applied during the reset operation. This type of switching is referred to as bipolar switching. Some examples of cells that exhibit bipolar switching behavior include resistive switching layers formed from MeOx having one inert electrode and one reactive electrode, e.g., TiN/MeOx/Pt and TiN/MeOx/poly-Si. Setting and resetting operations may be repeated multiple times as will now be described with reference to FIGS. 2A and 2B.

Figure 2A:
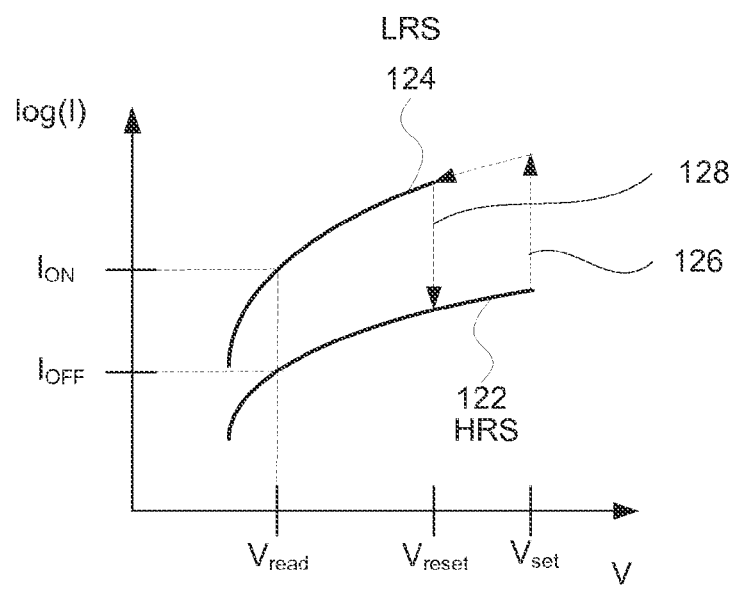
FIG. 2A illustrates a plot of a current passing through a unipolar ReRAM cell as a function of a voltage applied to the ReRAM cell, in accordance with some embodiments.
Figure 2B:
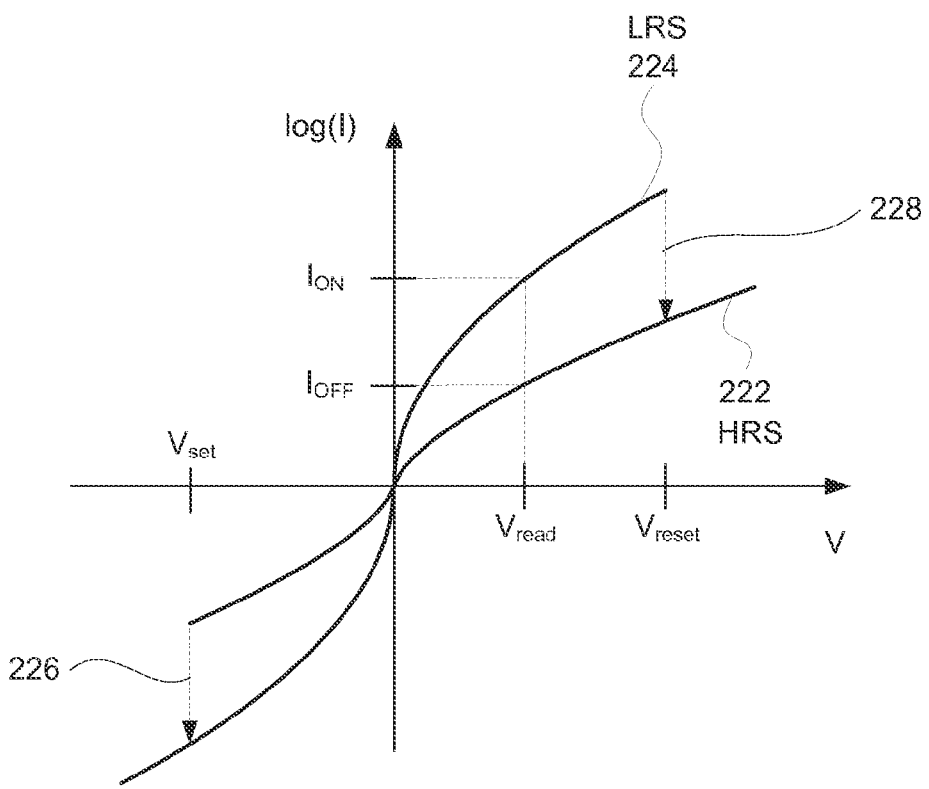
FIG. 2B illustrates the same type of a plot for a bipolar ReRAM cell, in accordance with some embodiments.

FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in FIG. 2A and by lines 222 and 224 respectively in FIG. 2B. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistance switching layer can be sensed by applying a sensing voltage to its electrodes. The sensing voltage is sometimes referred to as a "READ" voltage or simply a reading voltage and indicated as V$_{READ}$ in FIGS. 2A and 2B. If the ReRAM cell is in its HRS (represented by line 122 in FIGS. 2A and 2B), the external read and write circuitry connected to the electrodes will sense the resulting "OFF" current (I$_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current (I$_{OFF}$) when the read voltage (V$_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage (V$_{SET}$) to the electrodes. Applying the set voltage forms one or more conductive paths in the resistance switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage (V$_{READ}$) is applied to the electrodes of the cell in this state, the external read and write circuitry will sense the resulting "ON" current (I$_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage (V$_{RESET}$) is applied to the ReRAM cell to break the previously formed conductive paths in the resistance switching layer. Switching from a LRS to HRS is indicated by dashed line 128 in FIG. 2A and line 228. Detecting the state of the ReRAM cell while it is in its HRS is described above.

It should be noted that polarity of the reset voltage and the set voltage may be the same as shown in FIG. 2A or different as shown in FIG. 2B. The cells that have the same polarity of set and reset voltages are referred to as unipolar cells, while the cells that have different polarities of h set and reset voltages are referred to as bipolar cells. Without being restricted to any particular theory, it is believed that unipolar switching occurs due to metallic filament formation and destruction caused by resistive heating and application of electrical field. Bipolar switching is believed to be based on filaments formed from oxygen vacancies. The formation and rupture of filament is done by oxygen vacancy moving back and forth. The switching voltages of unipolar and bipolar switching are typically comparable. However, the endurance of bipolar is generally better than that of unipolar.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage (V$_{SET}$) is between about 100 mV and 12V or, more specifically, between about 500 mV and 5V. In some embodiments, the read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers In some embodiments, the same ReRAM cell may include two or more resistance switching layers interconnected in series. Adjacent resistance switching layers may directly interface each other or be separated by an intermediate layer.

The ReRAM cells can be configured in a cross point memory array. The cross point memory arrays can include horizontal word lines that cross vertical bit lines. Memory cells can be located at the cross points of the word lines and the bit lines. The memory cells can function as the storage elements of a memory array.

Figure 3:
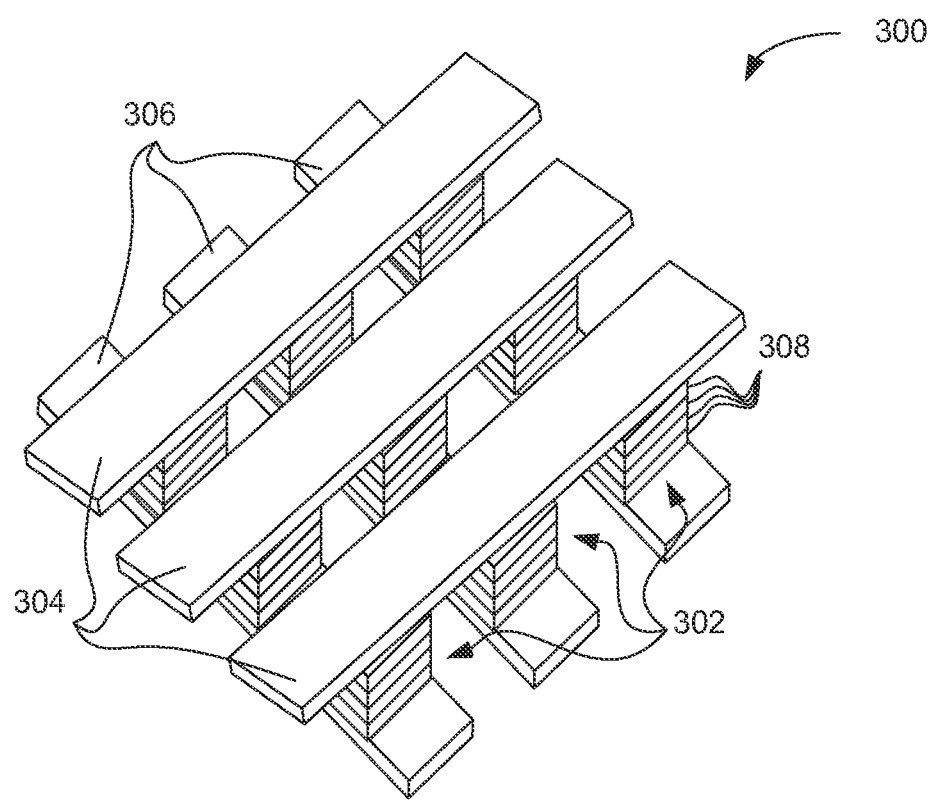
FIG. 3 illustrates a memory array of resistive switching memory elements according to some embodiments.

FIG. 3 illustrates a memory array of resistive switching memory elements according to some embodiments. Memory array 300 may be part of a memory device or other integrated circuit. Memory array 300 is an example of potential memory configurations; it is understood that several other configurations are possible.

Read and write circuitry may be connected to memory elements 302 using signal lines 304 and orthogonal signal lines 306. Signal lines such as signal lines 304 and signal lines 306 are sometimes referred to as word lines and bit lines and are used to read and write data into the elements 302 of array 300. Individual memory elements 302 or groups of memory elements 302 can be addressed using appropriate sets of signal lines 304 and 306. Memory element 302 may be formed from one or more layers 308 of materials, as is described in further detail below, and may include additional elements such as those described below, including selection or steering elements.

One having ordinary skills in the art would understand that other arrangements of memory cells are possible; in particular, a memory array can be a 3-D memory array. For example, several 2-D memory arrays (as shown in FIG. 3) can be stacked in a vertical fashion to make multi-layer 3-D memory arrays. As another example, one set of signal lines can be composed of vertical lines, and the other set of signal lines can be a composed of one or more subsets of horizontal lines, the subsets (if applicable) being positioned at an angle (e.g. orthogonally) to each other, and the memory devices can be formed as substantially concentric cylindrical layers around the vertical lines.

Any suitable read and write circuitry and array layout scheme may be used to construct a non-volatile memory device from resistive switching memory elements such as element 302. For example, horizontal and vertical lines 304 and 306 may be connected directly to the terminals of resistive switching memory elements 302. This is merely illustrative.

During the operation of the cross point memory array, such as a read operation, the state of a memory element 302 can be sensed by applying a sensing voltage (i.e., a "read" voltage) to an appropriate set of signal lines 304 and 306. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 304 and 306.

Ideally, only the selected memory cell, e.g., during a read operation, can experience a current. However, currents, often referred as sneak path currents, can flow through unselected memory elements during the read operation. The sensing the resistance state of a single memory call can be unreliable. For example, all memory cells in the array are coupled together through many parallel paths. The resistance measured at one cross point can include the resistance of the memory cell at that cross point in parallel with resistances of the memory cells in the other rows and columns.

Figure 4:
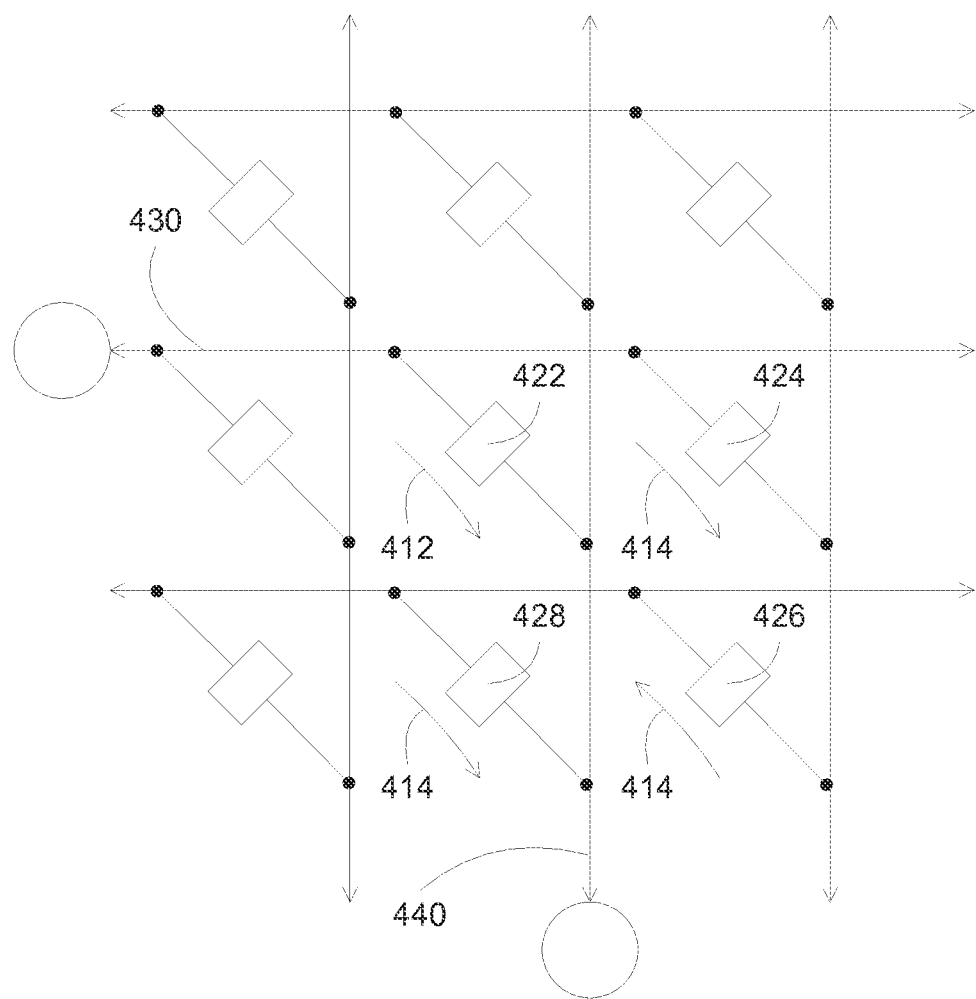
FIG. 4 illustrates sneak path currents in a cross point memory array according to some embodiments.

FIG. 4 illustrates sneak path currents in a cross point memory array according to some embodiments. A memory cell 422 can be selected, for example, for a read operation, by applying a voltage to signal line 430, and grounding signal line 440. A current can flow through the memory cell 422. However, parallel current paths, e.g., sneak path current, can exist, for example, represented by a series of memory cells 424, 426, and 428. The applied voltage (signal line 430) can generate a current 414 through memory cell 424, passing through memory cell 426, and returning to the ground (signal line 440) through memory cell 428.

There are multiple sneak path currents, and the resistances of the series memory cells can be smaller than that of the selected memory cell, thus can obscure the sense current through the selected memory cell during a read operation.

To reduce or eliminate the sneak path occurrence, a control device, e.g., a selector, can be used in the cross point memory array. For example, a series transistor or a diode can be located in a memory cell. The control device can isolate the selected memory cell from unselected memory cells by breaking parallel connections of the memory cells.

Figure 5:
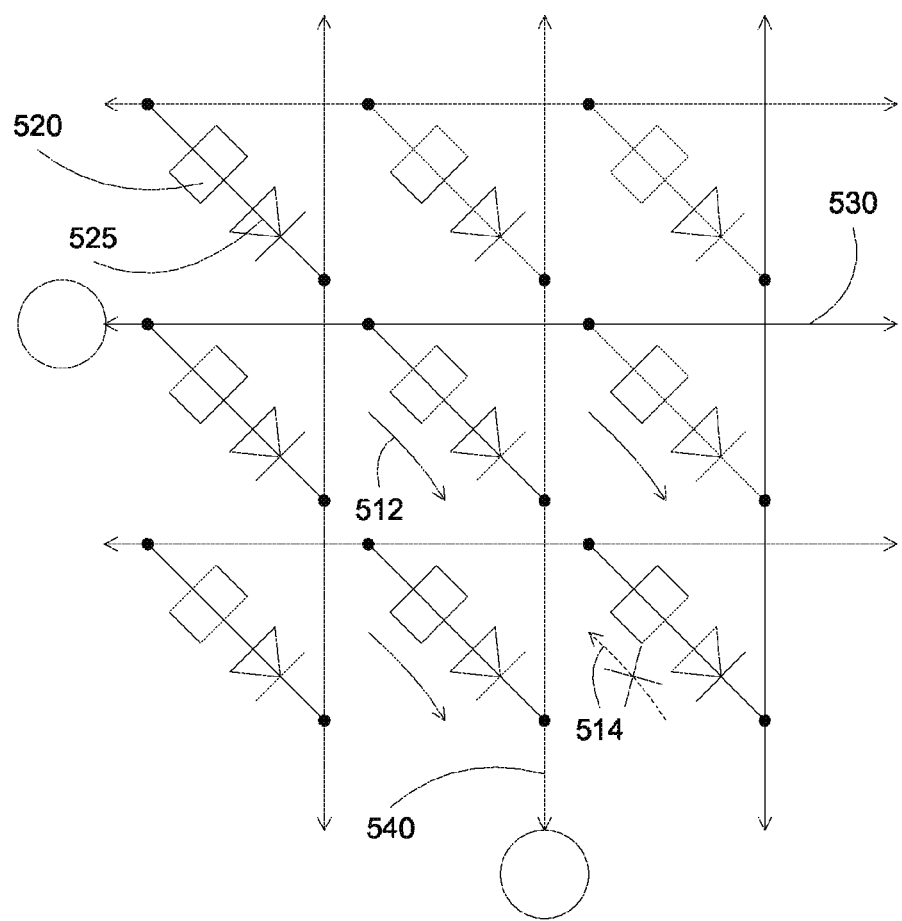
FIG. 5 illustrates a cross point memory array according to some embodiments.

FIG. 5 illustrates a cross point memory array according to some embodiments. A switching memory device can include a memory element 520 and a diode selector 525, which are both disposed between the electrodes 530 and 540. The diode selector 525 can be an intervening electrical component, disposed between electrode 530 and memory element 520, or between the electrode 540 and memory element 520. In some embodiments, the diode selector 525 may include two or more layers of materials that are configured to allow or inhibit the current flow in different directions through the memory element 520 when that memory element is not selected to read. For example, the diode selector can prevent a sneak path current 514 when the sense current 512 is generated.

Figure 6:
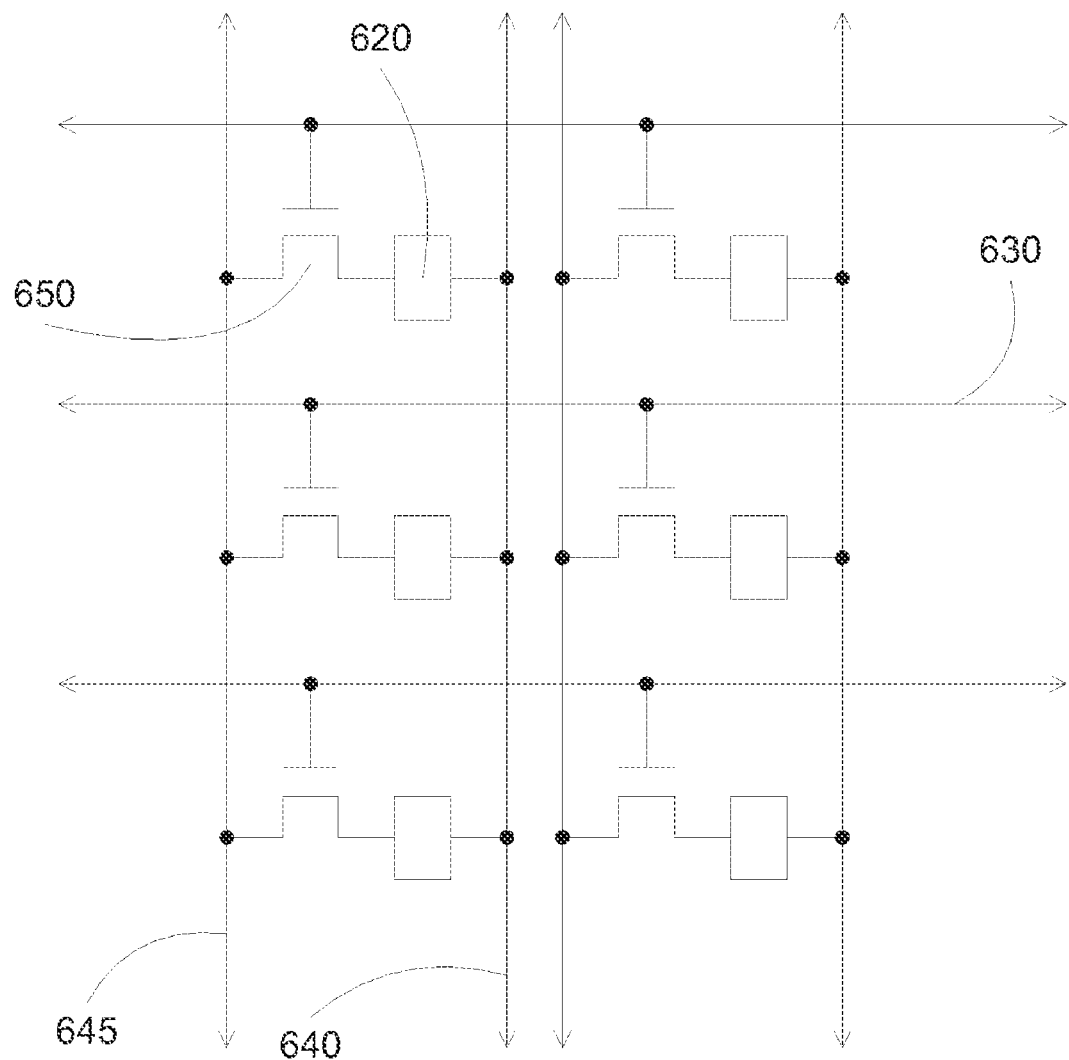
FIG. 6 illustrates a cross point memory array according to some embodiments.

For bipolar memory, the diode selector might not be suitable, since the voltage applied to the memory element can be at either polarity. A transistor selector can be used for isolating the memory element. FIG. 6 illustrates a cross point memory array according to some embodiments. A switching memory device can include a memory element 620, which can be disposed between the electrodes 640 and 645. The transistor selector 650 can be an intervening electrical component, disposed in series with the memory element 620 between electrode 640 and electrode 645. The transistor can be controlled by a control line 630 coupled to the gate of the transistor. A transistor can be turned by applying a voltage to the gate and the source or drain, e.g., control line 630 and electrode 645. The electrodes 640, electrodes 645 and control lines 630 can be biased by an external circuitry that is connected at the periphery of the memory array.

In some embodiments, a current limiter can be provided in series with the memory element to limit the current through the memory element, for example, during the set or reset operation.

A resistive memory element can require a minimum set current to cause the memory element to switch from a high resistance state, e.g., "0" state, to a low resistance state, e.g., "1" state. In practice, the difference between the applied set current and the minimum set current is much larger than necessary to cause the device to reliably switch to the logic "1" state, e.g., low resistance state. Further, it has been found that the magnitude of the current required to switch the memory element to a high resistance state from a low resistance state can be dependent on the magnitude of the current used to set the device in the low resistance state. If a high set current is used, then a higher "reset" current is required to achieve a desirable high resistance state. In other words, the difference between the applied reset current and the minimum reset current also needs to be larger than necessary to cause the device to switch from the "1" to the "0" state if the magnitude of the prior applied set current is too far from the minimum set current.

The larger than necessary swings in the current used to switch between the "1" and "0" states can damage the materials and components in the switching memory device, thus affecting the memory element's lifetime and reliability.

In some embodiments, the current limiter can be provided so that its impedance can limit the current through the memory element to a value that is just greater than the minimum set current, and still allow the "1" logic state to be reliably set by the applied $V_{SET}$ voltage. It is believed that the current limiter can also help reduce the apparent minimum set current, since the current limiter impedance can reduce the swing in current between the set and reset switching currents at the same fixed applied voltage, thus affecting the density and movement of the traps in the variable resistance layer. Not intending to be bound by theory, but it is believed that when a smaller "1" state switching current is applied to a device that the formed filaments, or aligned traps, in the variable resistance layer will be smaller in size than if a higher "1" current is applied, thus making the filaments easier to alter during the reset phase of the resistive switching process.

Figure 7:
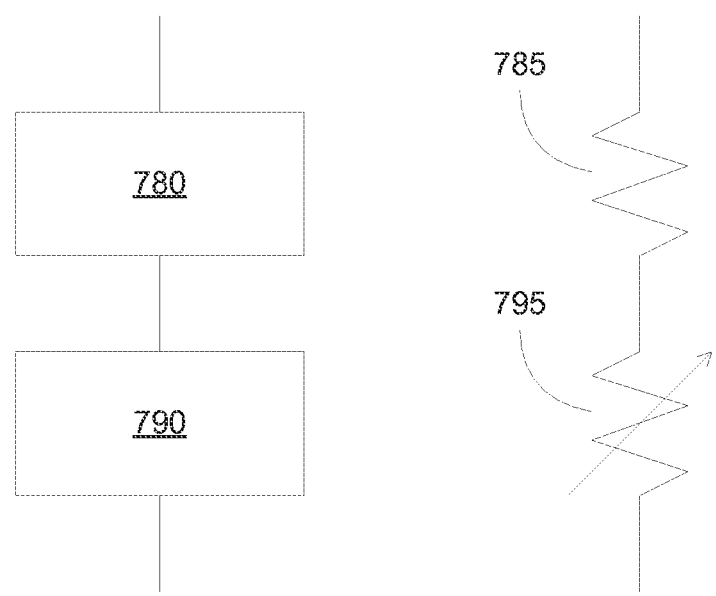
FIG. 7 illustrates an example of a current limiter circuit according to some embodiments.

FIG. 7 illustrates an example of a current limiter circuit according to some embodiments. A memory element 790 can be represented by a variable resistor. A current limiter circuit 780 can be represented by a resistor 785. By placing a current limiter 780 in series with a memory element 790, the set and reset currents can be reduced, leading to lower power consumption. Further, the low currents delivered to the memory element can reduce potential damages to the memory element, and also reduce the potential cross-talk between adjacently connected memory devices.

In some embodiments, methods and systems for lower current values through a memory element, for example, during a read operation or a set or reset operation, are provided. The current for the memory element can be significantly reduced at lower than the operating voltages, such as a read voltage, while still maintaining appropriate current at the operating voltages to avoid interfering with the memory device operations. A steering element can be optimized for one or more operation (such as read, set, and/or reset) that is performed at a specific operating voltage ($V_s$), but can be compatible with other operations. In some embodiments, the current can be small, e.g., between $10^{-10}$ and $10^{-6}$ A/cm$^2$, at half of the operating voltage ($V_s/2$) to prevent modification to the memory array. For high density memory devices, higher leakage currents can be acceptable, such as less than $10^3$ A/cm$^2$ for less than 10 micron size devices. The low current at half the operating voltage can ensure that when $V_s$ is applied to selected cell yet smaller voltages are applied to other cells in the same row or column, other cells not accidentally programmed and/or disturbed, and/or the state of other cells does not substantially affect the desired operation on the selected cell (such as the value of the sensed current during a read operation). For example, one way to perform an operation (such as a read operation) can be by applying $V_s/2$ to selected row and $-V_s/2$ to selected column, and grounding other rows and columns, so that the full operating voltage $V_s$ is applied to the selected cell, and a smaller voltage $V_s/2$ is applied to other cells on the selected row and column. Other methods of applying $V_s$ to the selected cell (e.g. during a read operation) may be preferred, but in general they all may potentially subject a large number of cells, or even the majority the cells in the array, to non-zero voltages no larger than $V_s/2$. The current selector thus can have high resistance at and below $V_s/2$ but much smaller resistance at the operating voltage $V_s$ and above.

In some embodiments, the current can be large, e.g., between $10^{-3}$ and $10^3$ A/cm$^2$, or between $10^1$ and $10^3$ A/cm$^2$, at voltages equal to (or higher than) the operating voltage. For high density memory devices, higher currents can be achieved, such as between $10^6$ and $10^7$ A/cm$^2$ for less than 10 micron size devices. For example, to allow switching of the memory cells, the currents should reach these values when sufficient voltages are applied to the switching layer. The voltage applied to the switching layer can be different (e.g., much larger) than the voltage that falls across the steering element. Because the steering element can be electrically in series with the switching layer, these high currents can flow through the steering element, and thus. the portion of the voltage that falls across the steering element during set and/or reset operation can be substantially higher than $V_s/2$, for example, it can be around or slightly above the operating voltage $V_s$. If a much larger voltage falls across the steering element while high currents are flowing through it, the Joule heating can lead to unintended thermal damage. In other words, the current selector can have very low resistance at $V_s$ to ensure that the voltage drop across the current selector can be minimal during the memory cell programming despite the high current levels.

Figure 8A:
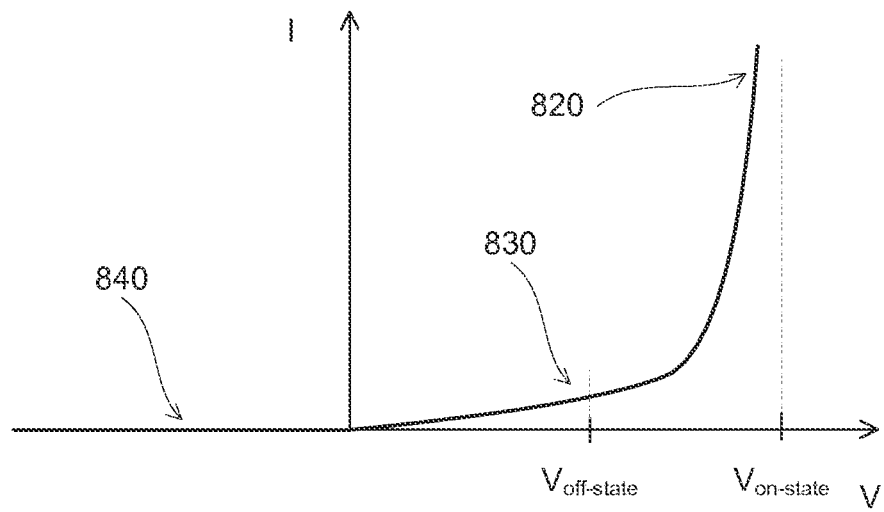
FIGS. 8A-8B illustrate examples of I-V response for a steering element according to some embodiments.
Figure 8B:
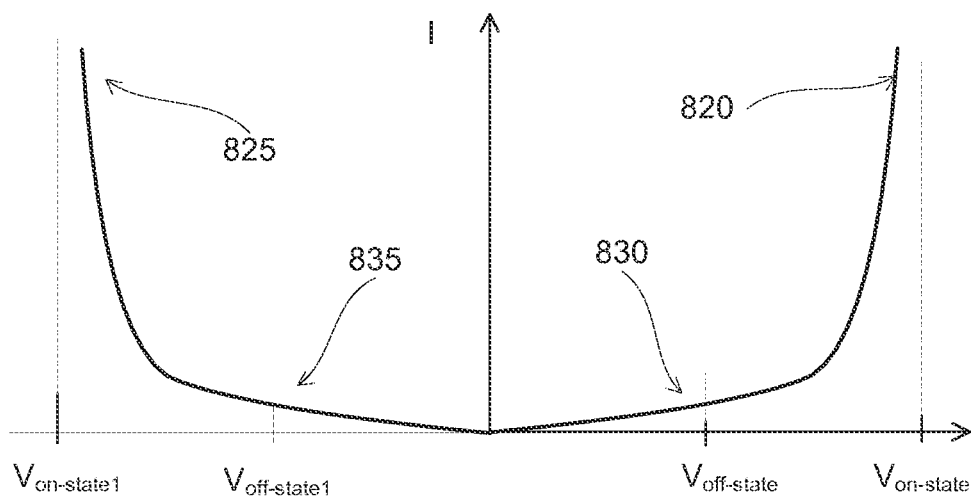

FIGS. 8A-8B illustrate examples of I-V response for a steering element according to some embodiments. These plots are given as an illustration and are not assuming any particular scale of the axes. In FIG. 8A, a current voltage response, e.g., I-V curve, for a steering element is shown. The current can start from low current (substantially zero current) at zero voltage, and can increase until the on-state voltage $V_{on-state}$ (e.g., the operating voltage $V_s$), which can be as high as the read voltage $V_{READ}$ or even higher, and beyond until the highest voltage used for any operation, such as $V_{SET}$. The current can slowly increase for low voltages that are less than $V_{off-state}$, e.g., less than $V_s/2$, and then rapidly increase toward the on-state voltage $V_{on-state}$. The low current at the vicinity of zero voltage can reduce the leakage current. For example, the current 830 at half the operating voltage can be less than about $10^{-6}$ A/cm$^2$, such as $10^{-10}$ and $10^{-6}$ A/cm$^2$, to prevent accidental changes to the memory cells. At high voltages, such as at the operating voltage $V_s$, the current can be very high to prevent any interference with the operation of the memory devices. For example, the current 820 at the operating voltage can be higher than about $10^{-3}$, such as between $10^{-3}$ and $10^3$ A/cm$^2$, or higher than about $10^1$ A/cm$^2$, such as between $10^1$ and $10^3$ A/cm$^2$, so that the voltage drop across the steering element is small. At opposite voltage, the current 840 can be small, e.g., negligible, to be used as a diode for unipolar memory cells. The current values can be dependent on memory density, for example, for memory sizes of a few hundred microns. For smaller memory sizes, such as less than 10 microns, higher leakage values (e.g., $10^3$ A/cm$^2$) at low voltages can be allowed, and higher current values (e.g., $10^{6-7}$ A/cm$^2$) at high voltages can be required. Note that the specific target current densities may depend on the dimensions of the device and the material used in the switching element; the above numbers are cited as an example.

FIG. 8B shows a current response for a steering element that can be used for bipolar memory cells. (The absolute value of current is shown regardless of the current direction.) The current response curve can be similar in both positive and negative polarities. For example, in the positive voltages, the current can be small 830 at $V_{off\text{-}state}$, and very large 820 at $V_{on\text{-}state}$. For negative voltages, the current behavior can be similar, e.g., small 835 at $V_{off\text{-}state1}$, and large 825 at $V_{on\text{-}state1}$. As shown, both curves are plotted on the upper half of an I-V coordinate, but in general, the left half can be plotted on an (-I)-(V) axis while the right half can be plotted on I-V axis. This approach can account for a linear-log plot, for example, with the voltage axis being linear and the current axis being logarithm.

In some embodiments, the curves can be symmetrical, e.g., $V_{off\text{-}state}=V_{off\text{-}state1}$ and $V_{on\text{-}state}=V_{on\text{-}state1}$. For example, in bipolar memory cell, the set voltage $V_{set}$ and reset voltage $V_{reset}$ can have a same magnitude with opposite polarities. In some embodiments, the curves can be asymmetrical, e.g., $V_{on\text{-}state}\neq V_{on\text{-}state1}$.

In some embodiments, designs for steering elements for resistive memory devices are provided. A steering element can be based on tunneling and/or thermionic conduction in the on-state, with minimum leakage in the off-state. At low voltages, e.g., lower than the operating voltages or at half an operating voltage, the current can be significantly reduced, while the current can remain the same or can be controlled to ensure proper operation of the memory devices. The lower current values at low voltages can also reduce power consumption and thus improve the power efficiency of the memory arrays. In some embodiments, the ratio of on-current to off-currents can be large (e.g., $>10^4$) with a high on-current (e.g., greater than $10^1$ A/cm$^2$ for large area memory devices and greater than $10^3$ or $10^6$ A/cm$^2$ for small area memory devices).

In some embodiments, steering elements are provided, including a graded dielectric alloy with an effective band gap gradually increasing towards the inside, e.g., center, of the dielectric layer. The electrode work function can also be selected to ensure that both thermionic and tunneling currents are suppressed in the off state but not in the on state.

Figure 9A:
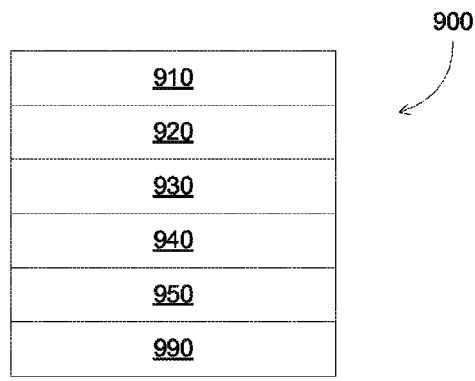
FIGS. 9A-9B illustrate an example of a current selector together with a memory stack incorporating the current selector according to some embodiments.
Figure 9B:
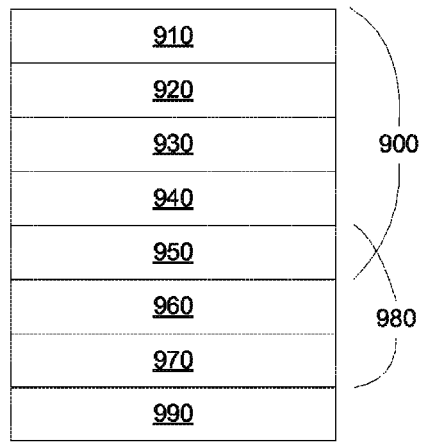

FIGS. 9A-9B illustrate an example of a current selector together with a memory stack incorporating the current selector according to some embodiments. In FIG. 9A, a current selector 900 can be disposed on a substrate 990, and can include a first graded dielectric layer 920 wherein the conduction band minimum of the band gap increases from electrode 910 to layer 930, a dielectric layer 930 with a substantially uniform composition, and a second graded dielectric layer 940 wherein the conduction band minimum of the band gap decreases from layer 940 to electrode 950, sandwiched between two electrodes 910 and 950. Other arrangements are possible as well and within the scope of this disclosure. A more detailed discussion of the arrangement and functionality of layers 920 through 940, and of possible alternative arrangements, is given below, and is illustrated in more detail in FIGS. 10-15.

In FIG. 9B, a current selector 900 can be placed in series with a memory element 980, which is disposed on a substrate 990. The memory element can include a switching layer 960 sandwiched between two electrodes 950 and 970. As shown, the current selector 900 and the memory element 980 share a common electrode 950.

Figure 10A:
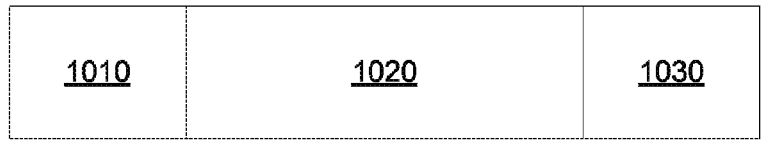
FIGS. 10A-10C illustrate an example of a steering element according to some embodiments.
Figure 10B:
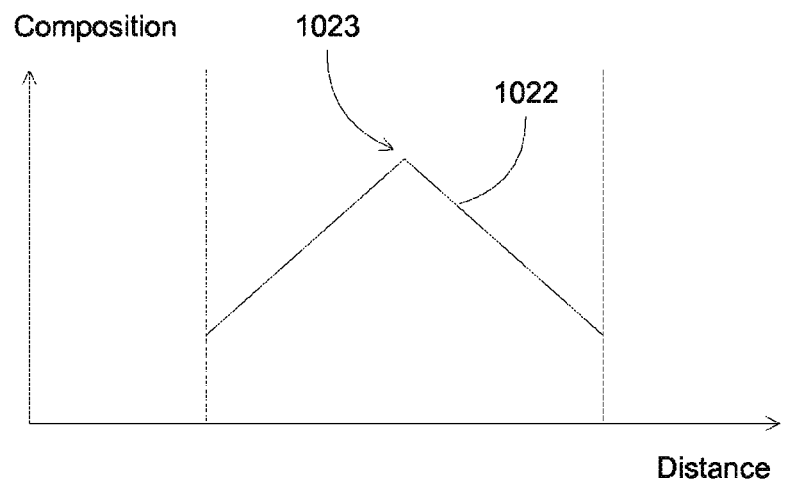
Figure 10C:
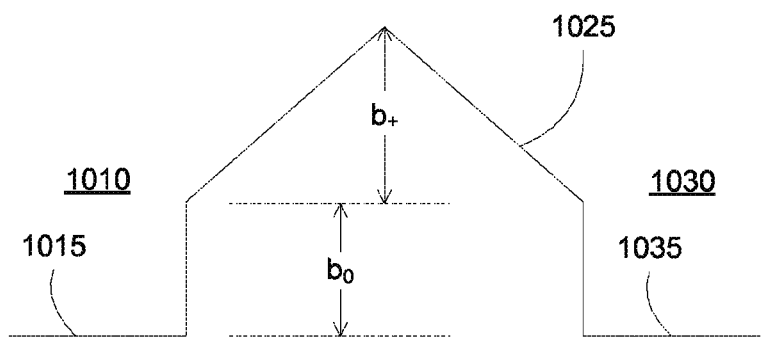

FIGS. 10A-10C illustrate an example of a steering element according to some embodiments. In FIG. 10A, a dielectric layer 1020 is sandwiched between two electrodes 1010 and 1030. In FIG. 10B, the composition 1022 of the dielectric layer 1020 is shown between the two electrodes 1010 and 1030. One or more parameters describing the composition of the dielectric layer 1020 can increase from the electrode 1010 to a point 1023 in the dielectric layer between the two electrodes. The parameters can decrease from the point 1023 to the electrode 1030. For example, the dielectric layer can include a composition of $(SrTi)_x(BaZr)_{1-x}O_3$, and the composition curve 1022 can represent the variation of parameter x, e.g., the change of Sr/Ti and Ba/Zr along the dielectric layer between the two electrodes. The composition is shown to be symmetric, with the point 1023 being the midpoint of the dielectric layer. Other composition profiles can be used.

FIG. 10C shows an energy band diagram of the steering element, including the Fermi levels 1015 and 1035 of the electrodes 1010 and 1030, respectively. The Fermi levels of the two electrodes can be equal, for example, by using the same material for the electrodes, with a symmetrical band diagram. A position-dependent conduction band minimum curve 1025 (i.e. the electronic level at the top of the band gap of the dielectric layer 1020, not accounting for the Schottky lowering effects) is also shown, exhibiting a graded band gap (e.g., conduction band minimum curve 1025). For visual clarity, the position-dependent valence band maximum is not shown, and can be below the Fermi levels 1015 and 1035. The conduction band minimum can have a positive slope near the electrode 1010, and a negative slope near the other electrode 1030. The conduction band minimum can be symmetric, reflecting the profile of the graded composition of the dielectric layer. The symmetrical energy band diagram of the steering element can allow similar behavior for both polarities of applied voltages. For example, the symmetrical steering element can be suitable for bipolar memory cells and arrays.

As shown, the conduction band minimum 1025 can have a maximum, for example, at a midpoint of the dielectric layer, raising to a value that is higher by $b_+$ than the lowest value of the conduction band minimum in the dielectric layer. The Fermi levels of the electrodes can form an energy barrier $b_0$ value with the lowest value of the conduction band minimum in the dielectric layer. The maximum barrier between the Fermi levels of the electrodes and the electronic excitations in the dielectric layer (e.g. as relevant to thermionic transport) can be $b_0+b_+$. (All the above values represent the values neglecting the Schottky lowering.)

Thermionic currents flowing over a thin dielectric barrier could provide quite high current densities (such as up to ~0.5 $10^7$ A/cm$^2$), and together with tunneling currents may be well sufficient for the on-state currents in a steering element. They also provide selectivity, e.g., the ratio of on-state current over the off-state current, by virtue of nonlinear current-voltage relation due to field-dependent Schottky lowering. However, high selectivity, e.g. of greater than or equal to about $10^4$, can require that the thermionic barrier be lowered by $\sim\ln(10^4)$ $k_BT \sim 9$ $k_BT \sim 0.25$ eV (assuming near-room temperature) as the voltage is increased from $V_{off\text{-}state}$ (e.g. about 1-2 V) to $V_{on\text{-}state}$ (e.g. about 2-5 V).

In a non-graded homogeneous dielectric film, thermionic current cannot provide high selectivity from just the Schottky lowering unless a film is thinner than 3 nm. For example, the lowering of a "flat" conduction band minimum of a dielectric band gap (such as that in a non-graded homogeneous dielectric film) in a film with unity dielectric constant κ=1 can be

| dielectric thickness | Schottky lowering at 1 V | Schottky lowering at 2 V |
|---|---|---|
| 10 nm | 0.38 eV | 0.53 eV |
| 5 nm | 0.53 eV | 0.75 eV |
| 3 nm | 0.69 eV | 0.97 eV |

The above table shows that when the thickness is lowered below 5 nm, the barrier heights at 1V and 2V begin to differ by the necessary ~0.25 eV. For a realistic dielectric, the Schottky lowering can be further decreased by $\sqrt{\kappa}$, which can require even thinner dielectrics. At such small thickness values, tunneling currents become dominant. Moreover, at short thickness, the Schottky lowering at small voltages does not decrease with V, but rather saturates, since the dielectric thickness is insufficient to provide the separation between the electron and its image charges corresponding to the barrier maximum in the usual Schottky formula. This further decreases the selectivity of thermionic steering.

In some embodiments, a graded energy barrier is provided that can improve the selectivity based on the thermionic current. For example, if the energy barrier in the center is raised by $b_+$, the Schottky-lowered conduction band minimum profile can correspond to $(V-2b_+/e)/d$, instead of $V/d$ (the factor 2 reflects that the distance from the barrier maximum to the electrode is $d/2$). If the applied off-state voltage $V_{off-state}$ is much smaller than $b_+/e$, Schottky maximum does not exist, and the barrier height is determined by the maximum barrier height $b_o+b_+$ in the middle of the dielectric, slightly lowered by the image charge correction:

$$b_{off-state} = b_0 + b_+ - e\frac{V_{off-state}}{2} - \frac{e^2}{8\pi\kappa\varepsilon_0 d}.$$

The last term, corresponding to the image charge correction, can be usually neglected. For example, even in a 2 nm-thick film with κ=5, it is only 0.07 eV.

On the other hand, when a sufficiently high ($\gg b_+/e$) on-state voltage $V_{on-state}$ is applied, the barrier is given by the minimum barrier height $b_0$, Schottky-lowered in the effective field $(V-2b_+/e)/d$:

$$b_{on-state} = b_0 - \frac{V_{on-state}}{2} - \sqrt{\frac{e^3(V_{on-state} - 2b_+/e)}{4\pi\kappa\varepsilon_0 d}}.$$

The steering selectivity is given by the current ratio:

$$f = \frac{J_{on-state}}{J_{on-state}} = \exp[(b_{off-state} - b_{on-state})/kT].$$

The selectivity is maximized when $$b_+ e \frac{V_{on-state}}{2} - \frac{e^2}{8\pi\kappa\varepsilon_0 d}.$$

The last term is small and can often be neglected.

Figure 11A:
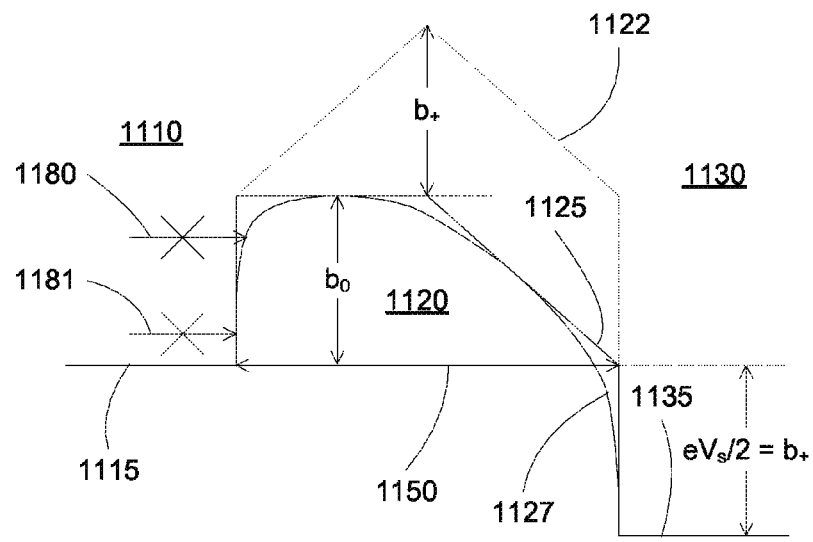
FIGS. 11A-11B illustrates a schematic of the operation of the current selector at low voltages according to some embodiments.
Figure 11B:
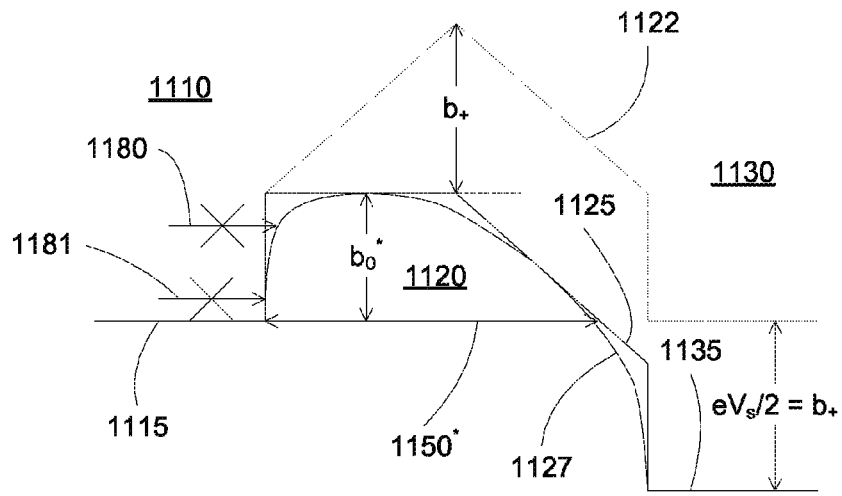

FIGS. 11A-11B illustrate a schematic of the operation of the steering element at low voltages according to some embodiments. The explanation serves as an illustration, and does not mean to bind the disclosure to any particular theory. A steering element can include a dielectric layer 1120, positioned between electrodes 1110 and 1130. The energy band shown includes the Fermi levels 1115 and 1135 for the electrodes 1110 and 1130, respectively, and the electron portion of the band diagram, e.g., the conduction band minimum, for the steering element.

In FIG. 11A, a positive voltage $V_{off-state}$, such as $V_s/2$ with $V_s$ being the operating voltage of the memory device, can be applied to the electrode 1130, lowering the Fermi level 1135 of the electrode 1130. The conduction band minimum 1125 can be lowered correspondingly (even neglecting the additional Schottky lowering), e.g., from the original conduction band minimum 1122. There is no thermionic current 1180 in a relatively wide energy range above the Fermi level 1115, since the thermionic currents are suppressed by the large value of the Schottky barrier (only a minimal thermionic current will appear due to the exponentially suppressed thermal excitations at much higher energies). There is no tunneling current 1181 (or only minimum leakage current) passing through the steering element in the low voltage region, which is suppressed by the thickness 1150 of the dielectric layer 1120. According to [00116], the offset $b_+$ can be approximately equal to the applied voltage $V_s/2$ as shown, which can lead to a flat conduction band minimum curve of the dielectric layer, resulting in a high thickness 1150. Also shown in the band bending 1127 due to the Schottky lowering, rounding the ideal conduction band minimum curve 1125. There can be small change from the two bands 1125 and 1127, such as the negligible term from the calculated $b_+$ as discussed above, or such as modifications due to quantum corrections, typically manifested at scale of a few angstroms.

In FIG. 11B, a different electrode can be used, resulting in a different work function for the two electrodes. The band offset $b_0^*$ can depend roughly linearly on the work functions of the electrodes, and the thickness of the dielectric 1150* can be changed accordingly. The explanation is illustrative. Specific operations of the steering element can depend on the materials, the properties, and the process conditions of the device.

Figure 12A:
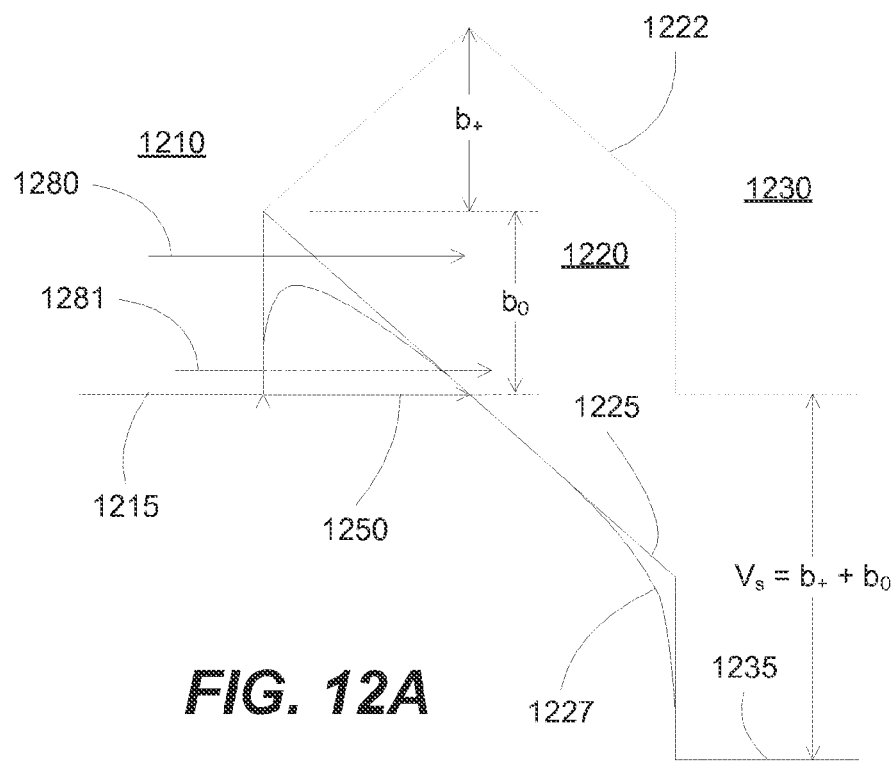
FIGS. 12A-12B illustrates a schematic of the operation of the current selector at high voltages according to some embodiments.
Figure 12B:
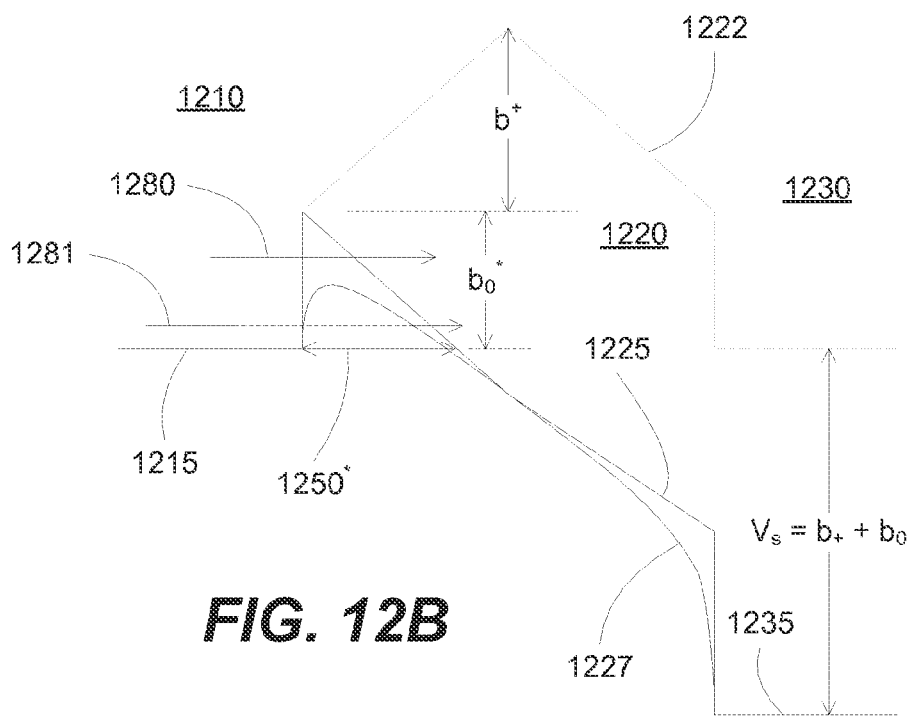

FIGS. 12A-12B illustrate a schematic of the operation of the steering element at high voltages according to some embodiments. The explanation serves as an illustration, and does not mean to bind the disclosure to any particular theory. A steering element can include a dielectric layer 1220, positioned between electrodes 1210 and 1230. The energy band shown includes the Fermi levels 1215 and 1235 for the electrodes 1210 and 1230, respectively, and the electron portion of the band diagram, e.g., the conduction band minimum, for the steering element.

In FIG. 12A, a positive voltage $V_{on-state}$, such as $V_s$ with $V_s$ being the operating voltage of the memory device, can be applied to the electrode 1230, lowering the Fermi level 1235 of the electrode 1230. The conduction band minimum 1225 can be lowered correspondingly, e.g., from the original conduction band minimum 1222. There is considerable thermionic current 1280 within the energy range relatively close to the Fermi level 1215, above the lowered Schottky barrier. There is also considerable tunneling current 1281 passing through the steering element in the high voltage region, since the electrons can travel through the lowered Schottky barrier and the thickness 1250 of the dielectric layer 1220. As shown, the offset $b_0$ can be equal to the applied voltage $V_s$, resulting in small thickness 1250. Also shown in the band bending 1227, rounding the ideal conduction band minimum curve 1225.

In FIG. 12B, a different electrode can be used, resulting in a different work function for the two electrodes. The band offset $b_0^*$ can be proportional to the work functions of the electrodes, and the thickness of the dielectric 1250\* can be changed accordingly. The explanation is illustrative. Specific operations of the steering element can depend on the materials, the properties, and the process conditions of the device.

For sufficiently high barrier heights $b_o$, the thermionic selectivity does not depend on the minimum barrier height $b_o$, which thus can be optimized to achieve maximum contribution from the tunneling currents to switching. Since Fowler-Nordheim type tunneling is more sensitive to the field than the direct tunneling due to a decrease in the tunneling length (this decrease is also illustrated in the above figure), the barrier can be sufficiently small, e.g., $b_0 < eV_{off\text{-}state}$.

On the other hand, as the barrier cannot be decreased to below zero, one can aim at $$b_0 > e\frac{V_{on-state}}{2} - \sqrt{\frac{e^3(V_{on-state} - 2b_+/e)}{4\pi\kappa\varepsilon_0 d}},$$

which together with the target value of $b_+$ can give the target range of the $b_0$ values:

$$e\frac{V_{on-state}}{2} - \sqrt{\frac{e^3(V_{on-state})}{4\pi\kappa\varepsilon_0 d}} > b_0 > eV_{off-state}.$$

In practical design, the actual values of the barriers may not be known exactly, and the logistical problems may cause the conduction band minimum profile and/or electrode work functions to deviate from the ideal linear composition.

In addition, the alloyed materials can pertain to the same underlying lattice structure, to avoid unforeseen band shifts due to structural transformations. Further, the valence band offsets can be reasonably close to the above target values, for example, $V_{off\text{-}state}$ between 1-2 V, and $V_{on\text{-}state}$ between 2 and 5V. In some embodiments, the electrodes can include TiN. The dielectric can include $(SrTi)_x(BaZr)_{1-x}O_3$, graded to have a varied composition, e.g., changing from x=0.8-1.0 near electrodes to x=0.0-0.2 in the center.

Other designs can be used. For example, a steering element can have asymmetric current-voltage (I-V) characteristics, or with $V_{off\text{-}state}$ different from $V_{on\text{-}state}/2$. An alternative design can also be used in which the barrier for electrons is at all times higher than that for holes, and the above expressions (with appropriate sign changes) apply to the values of the hole barriers.

Figure 13A:
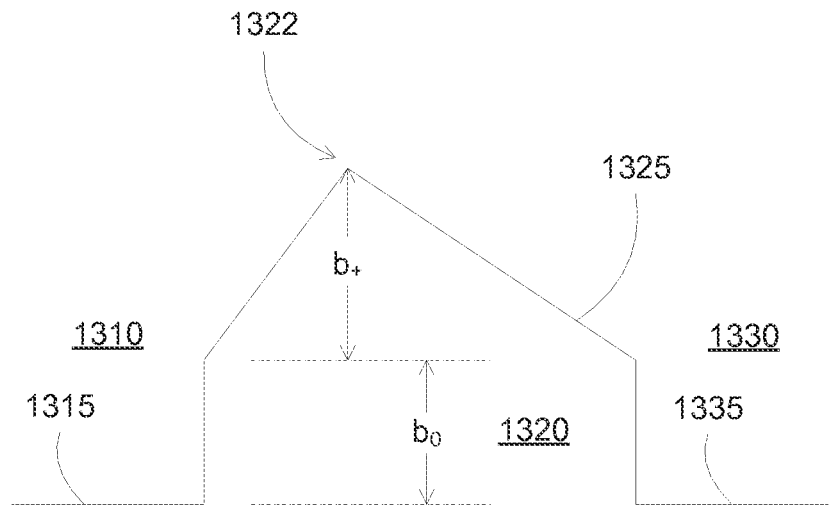
FIGS. 13A-13B illustrate different steering elements having similar electrodes according to some embodiments.
Figure 13B:
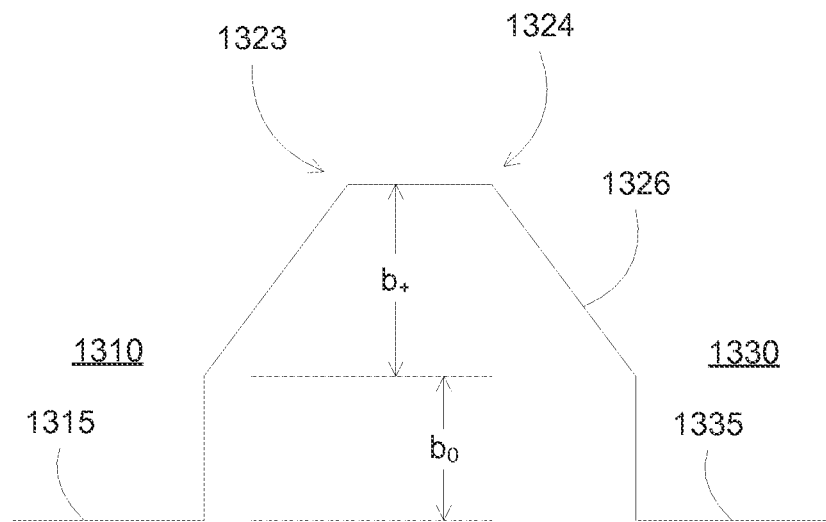

FIGS. 13A-13B illustrate different steering elements having similar electrodes according to some embodiments. In FIG. 13A, a steering element can include a dielectric layer 1320 sandwiched between two electrode 1310 and 1330. The energy band shown includes the Fermi levels 1315 and 1335 for the electrodes 1310 and 1330, respectively, and the electron portion of the band diagram, e.g., the conduction band minimum 1325, for the steering element. The band diagram 1325 of the dielectric layer 1320 can have a peak at a point 1322 within the dielectric layer, which might or might not be the midpoint of the dielectric layer 1320. Similar or different concentration profiles, and correspondingly energy band diagram, for the different portions of the dielectric layer 1320 can be used.

In FIG. 13B, the band diagram 1326 of the dielectric layer can increase from the electrode 1310 to a point 1323, and can decrease from another point 1324 to the electrode 1330. The band can be flat between these two points 1323 and 1324.

Figure 14A:
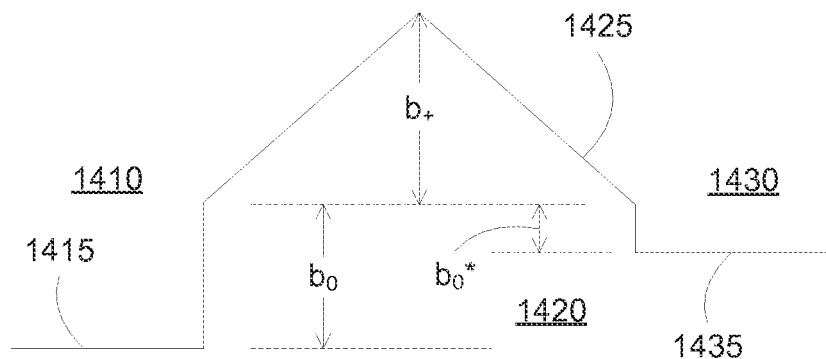
FIGS. 14A-14B illustrate different steering elements having different electrodes according to some embodiments.
Figure 14B:
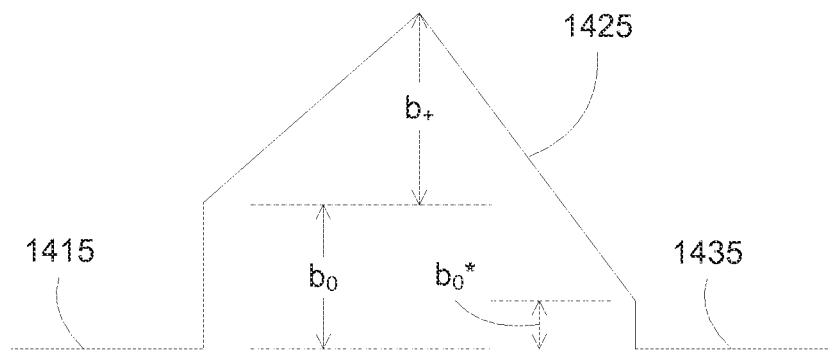

FIGS. 14A-14B illustrate different steering elements having different electrodes according to some embodiments. In FIG. 14A, a steering element can include a dielectric layer 1420 sandwiched between two electrode 1410 and 1430. The energy band shown includes the Fermi levels 1415 and 1435 for the electrodes 1410 and 1430, respectively, and the electron portion of the band diagram, e.g., the conduction band minimum 1425, for the steering element. The conduction band minimum 1425 can be symmetric, with a maximum point at midpoint of the dielectric layer. The electrodes can be different electrodes having different work function value. In FIG. 14B, the steering element is in equilibrium, with the Fermi levels of the two electrodes equalized, resulting in an asymmetric band diagram for the dielectric layer.

Figure 15A:
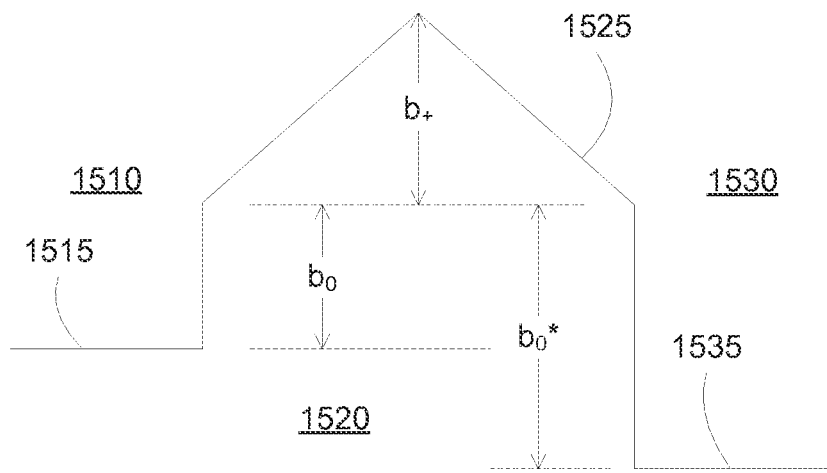
FIGS. 15A-15B illustrate different steering elements having different electrodes according to some embodiments.
Figure 15B:
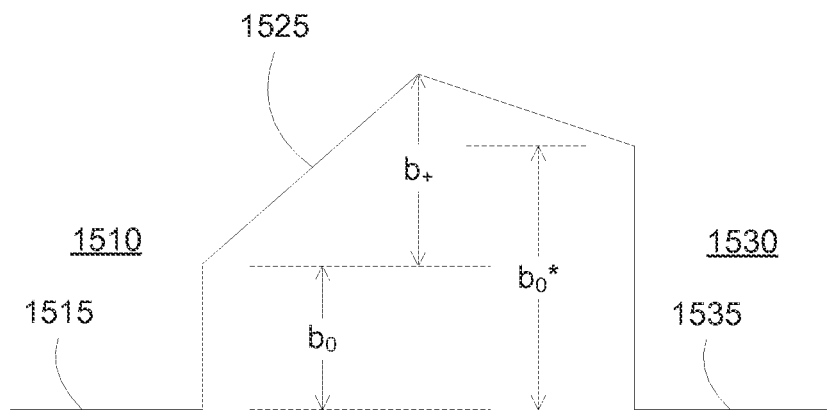

FIGS. 15A-15B illustrate different steering elements having different electrodes according to some embodiments. In FIG. 15A, a steering element can include a dielectric layer 1520 sandwiched between two electrode 1510 and 1530. The energy band shown includes the Fermi levels 1515 and 1535 for the electrodes 1510 and 1530, respectively, and the electron portion of the band diagram, e.g., the conduction band minimum 1525, for the steering element. The conduction band minimum 1525 can be symmetric, with a maximum point at midpoint of the dielectric layer. The electrodes can be different electrodes having different work function value. In FIG. 15B, the steering element is in equilibrium, with the Fermi levels of the two electrodes equalized, resulting in an asymmetric band diagram for the dielectric layer.

Figure 16:
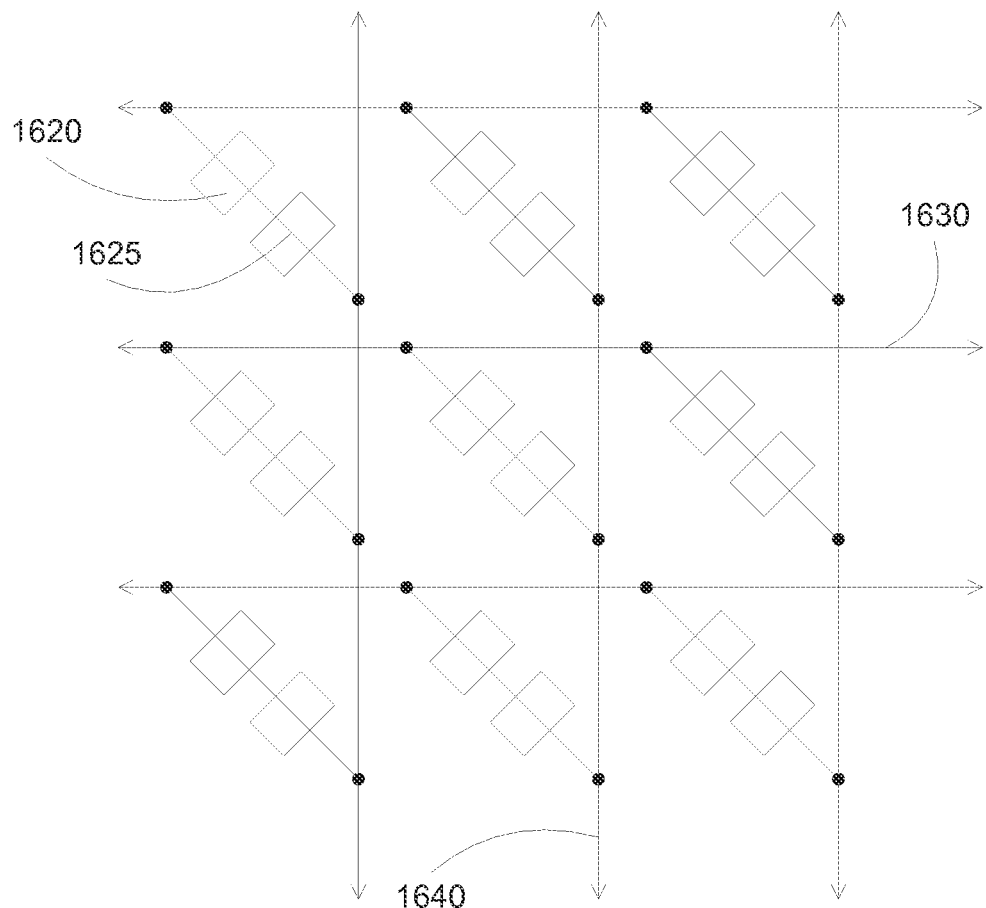
FIG. 16 illustrates a cross point memory array according to some embodiments.

In some embodiments, the memory device including a memory element and a steering element can be used in a memory array, such as a cross point array. For example, the steering element can be fabricated on the memory element, forming a columnar memory device, which can be placed at the cross points of the word lines and bit lines. FIG. 16 illustrates a cross point memory array according to some embodiments. A switching memory device can include a memory element 1620 and a steering element 1625, which are both disposed between the electrodes 1630 and 1640. The steering element 1625 can be an intervening electrical component, disposed between electrode 1630 and memory element 1620, or between the electrode 1640 and memory element 1620. In some embodiments, the steering element 1625 may include one or more additional layers of materials as discussed above.

Figure 17:
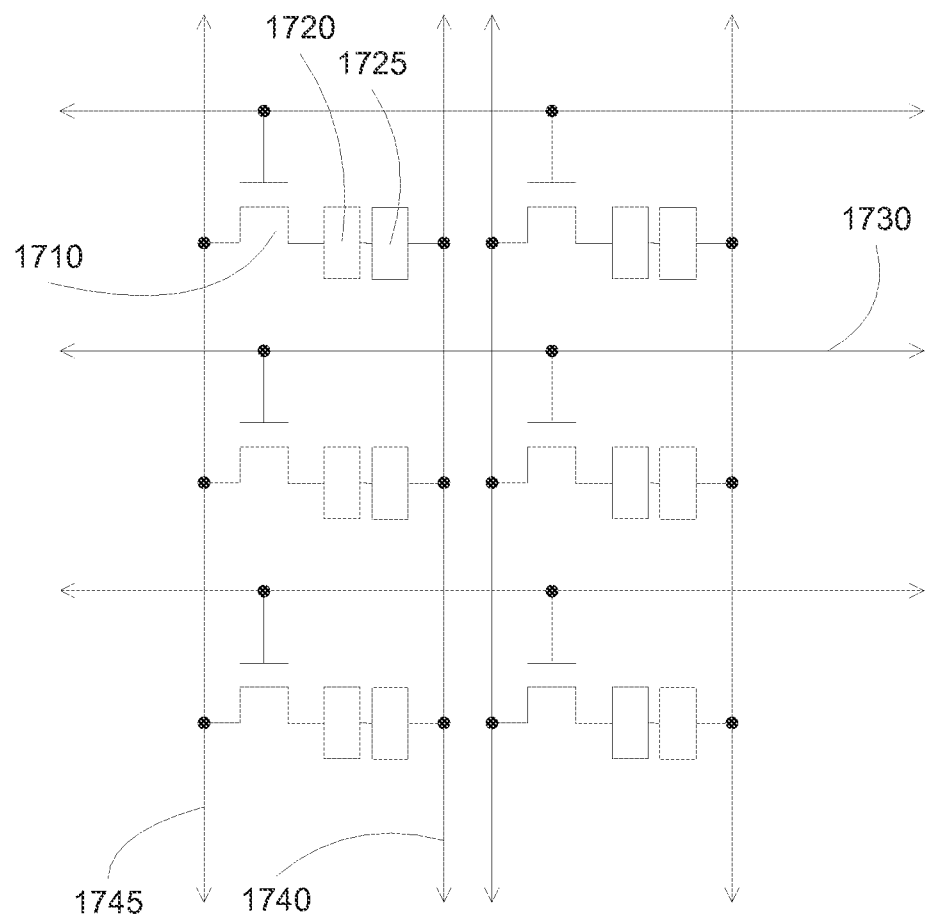
FIG. 17 illustrates a cross point memory array according to some embodiments.

FIG. 17 illustrates a cross point memory array according to some embodiments. A switching memory device can include a memory element 1720 and a steering element 1725, which are both disposed between the electrodes 1740 and 1745. Another steering element, such as a transistor 1710, can be used to isolate the memory devices, for example, through the control lines 1730.

Figure 18:
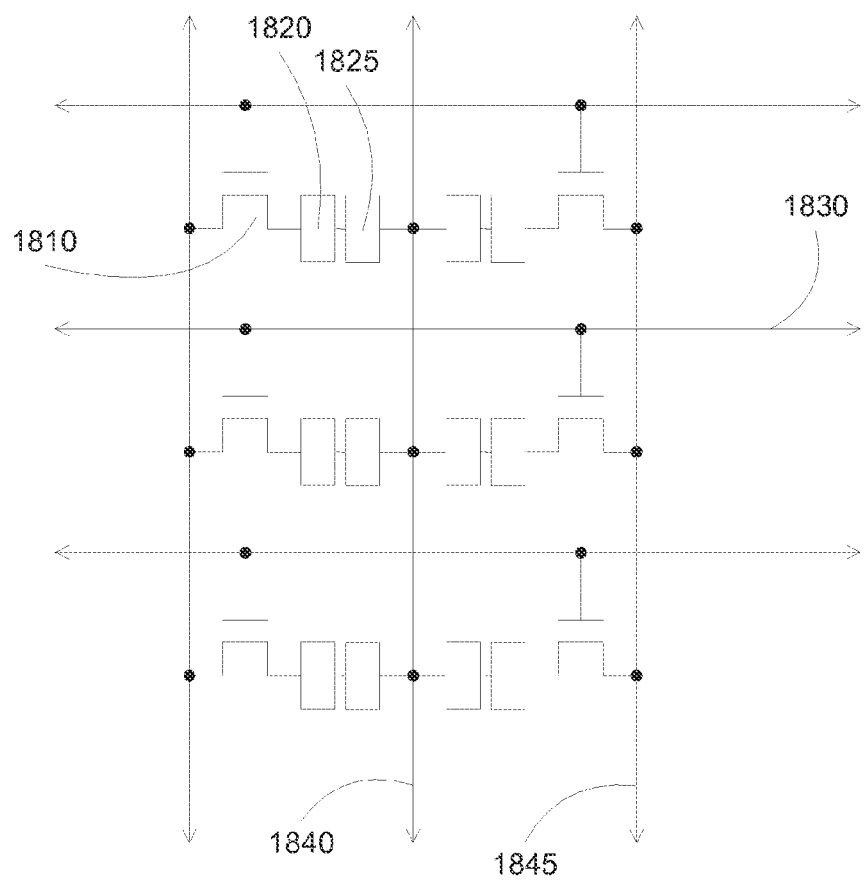
FIG. 18 illustrates another cross point memory array according to some embodiments.

FIG. 18 illustrates another cross point memory array according to some embodiments. The memory devices can be connected back to back, sharing electrodes 1840 and 1845. Control lines 1830 can be used to turn on transistor 1810, to select memory element 1820 and steering element 1825.

In some embodiments, methods to form steering element can be provided. The methods can include depositing a dielectric layer with a graded band gap, such as a graded conduction band minimum. A treatment can be performed after the deposition of the dielectric layer. The treatment can include rapid thermal annealing or plasma treatment in an oxidation ambient or in a reduced ambient, such as a rapid thermal anneal in temperatures between 200 and 400 C, plasma oxygen anneal, and/or in-situ annealing after deposition.

Figure 19:
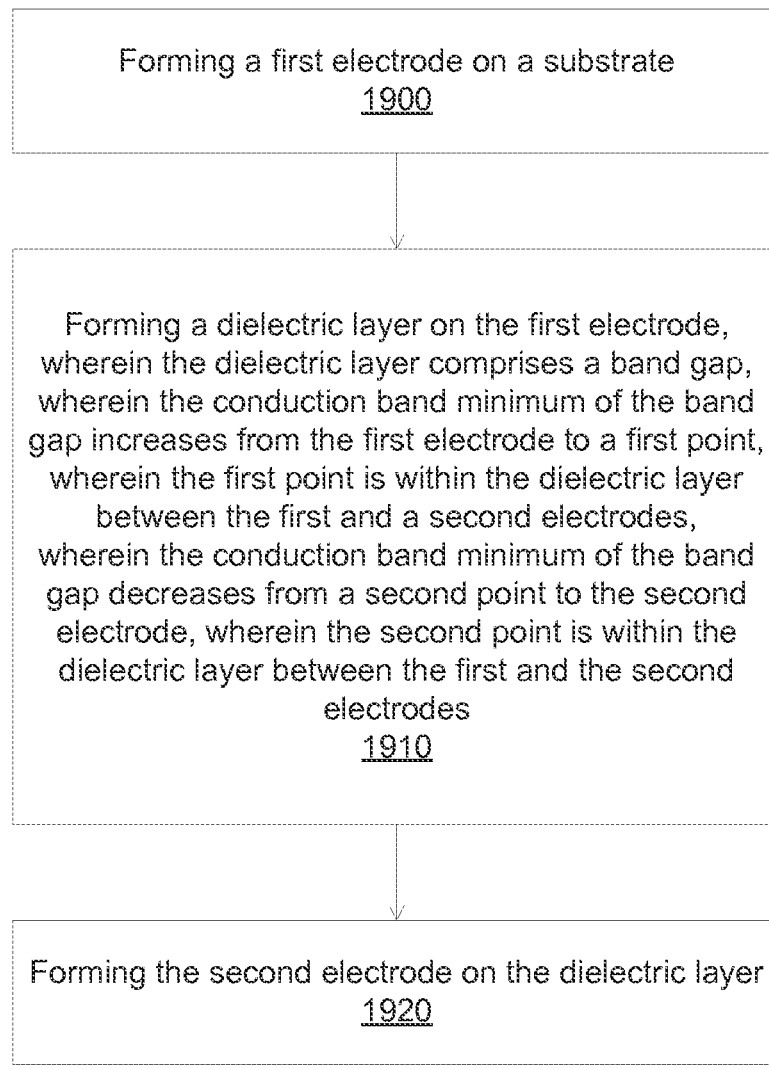
FIG. 19 illustrates a flowchart for forming a current selector according to some embodiments.

FIG. 19 illustrates a flowchart for forming a steering element according to some embodiments. The described flowchart is a general description of techniques used to form the steering elements described above. The flowchart describes techniques for forming a steering element generally including two electrodes and one or more dielectric layers disposed in between. Although certain processing techniques and specifications are described, it is understood that various other techniques and modifications of the techniques described herein may also be used.

In operation 1900, a first electrode layer is formed. The first electrode layer can be formed on a substrate, for example, a silicon substrate that may include one or more layers already formed thereon. In some embodiments, the first layer can be a polysilicon layer or a metal containing layer. For example, the first layer can be a highly doped polysilicon layer that is formed using a conventional chemical vapor deposition (CVD) or atomic layer deposition (ALD) type polysilicon deposition technique. In some cases, an optional native oxide layer removal step may be performed after forming the first layer by use of a wet chemical processing technique, or conventional dry clean process that is performed in a plasma processing chamber. It should be noted that the first layer may be provided on a substrate that may have a resistive memory element and the electrode formed thereon as well. Alternatively, in the case where no other device is provided, the first layer can be the bottom electrode. The first electrode layer can include TiN, TaN, Ni, Pt, or Ru. Other elements can also be used, such as Ti, Al, $MoO_2$, W, poly-Si, TiSiN, TaSiN, or any combination, mixture or alloy thereof that can be formed using PVD or other processes. For example, the first electrode can be sputtered by bombarding a metal target at 150-500 W with a pressure of 2-10 mTorr for a deposition rate of approximately 0.5-5 Å/s. These specifications are given as examples, the specifications can vary greatly depending on the material to be deposited, the tool used to deposit the material, and the desired speed of deposition. The duration of the bombardment can determine the thickness of the electrode. Other processing techniques, such as ALD, pulsed layer deposition (PLD), physical vapor deposition (PVD), CVD, evaporation, etc. can also be used to deposit the first electrode. In some embodiments, the first electrode is in contact with one of the signal lines. The first electrode may have any thickness, for example between about 5 nm and about 500 nm thick.

In operation 1910, a dielectric layer can be formed on the first electrode. The dielectric layer can have a band gap, with the conduction band minimum of the band gap increased from the first electrode to a first point within the dielectric layer, and then decreased from a second point within the dielectric layer to a second electrode disposed on the dielectric layer. The increased or decreased energy profile can be linear or non-linear, e.g., a straight line, multiple straight line segments, a curved line, multiple curved lines, or any combination thereof. The energy profile can be a theoretical approximation describing the local density of allowed electronic states throughout the dielectric thickness, as can follow from the variation of composition given by reasonably accurate theoretical model(s), and needs not to correspond to directly measurable energy-related quantities. The first dielectric layer can include $(SrTi)_x(BaZr)_{1-x}O_3$. The thickness of the dielectric layer can be between 2 nm and 10 nm, and minimizing tunneling at low voltages (less than 2 V). An optional treatment can be performed after depositing the dielectric layer. The treatment can include a plasma treatment or a high temperature treatment in an oxidation ambient or in a reduced ambient. For example, the treatment can include a rapid thermal oxidation at 300 C in oxygen ambient. The treatment can be performed in-situ after the deposition of the first electrode layer. The treatment can include an oxygen radical anneal, e.g., plasma anneal in an oxygen ambient.

In some embodiments, the dielectric layer can be deposited by a PVD or ALD process. For example, an ALD process can include $O_3$ oxidant, at about 250-300 C deposition temperature.

In operation 1920, a second electrode layer is formed on the dielectric layer. The second electrode layer can include TiN, TaN, Ni, Pt, or Ru. Other elements can also be used, such as Ti, Al, $MoO_2$, W, poly-Si, TiSiN, TaSiN, or any combination, mixture or alloy thereof that can be formed using PVD or other processes. The second electrode can have any thickness, for example between about 5 nm and about 500 nm thick.

In some embodiments, the conduction band minimum is symmetric. The first and second electrodes can be the same or can be different. For example, the work functions of the first and second electrodes can be the same. Same materials and processes can produce symmetrical steering elements. Different materials and/or processes can produce asymmetrical steering elements.

In some embodiments, the first point can coincide with the second point. For example, the first point can coincide with the second point and located at the mid point of the dielectric layer. The thickness of the dielectric layer is between 3 and 10 nm.

In some embodiments, the first point and the second point can be different, e.g., the energy profile or the composition profile can increase, e.g., linear or non-linear, from the first electrode to the first point, and can decrease, e.g., linear or non-linear, from the second point to the second electrode. The profiles between the two points can be linear or non-linear, with a flat slope or a slanted slope.

In some embodiments, the conduction band minimum can gradually vary from the first electrode to the first point or can gradually vary from the second point to the second electrode.

In some embodiments, the composition of the dielectric layer can gradually vary from the first electrode to the first point or can gradually vary from the second point to the second electrode.

In some embodiments, the dielectric layer can include at least two elements, or generally two sets of elements, with the ratio of the respective elements in the two sets varied and with the ratio of the elements within the same set fixed. For example, one set of elements for the dielectric layer can include SrTi and another set of elements can include BaZr, combining with oxygen to form $(SrTi)_x(BaZr)_{1-x}O_3$. The ratio of SrTi and BaZr can vary along the dielectric layer.

In some embodiments, the work function of the first or second electrode is configured to suppress tunneling and thermionic current in an off-state of the steering element, the work function of the first or second electrode is configured to maximize a ratio of the tunneling and thermionic currents in an on-state and in an off-state of the steering element, or the off-state is characterized by an off-voltage applied between the first and second electrodes, wherein the on-state is characterized by an on-voltage applied between the first and second electrodes, wherein the off-state voltage is half of the on-state voltage.

In some embodiments, the slopes of the conduction band minimum are configured to suppress tunneling and thermionic current in an off-state of the steering element, the slopes of the conduction band minimum are configured to maximize a ratio of the tunneling and thermionic currents in an on-state and in an off-state of the steering element, or the off-state is characterized by an off-voltage applied between the first and second electrodes, wherein the on-state is characterized by an on-voltage applied between the first and second electrodes, wherein the off-state voltage is half of the on-state voltage.

Figure 20:
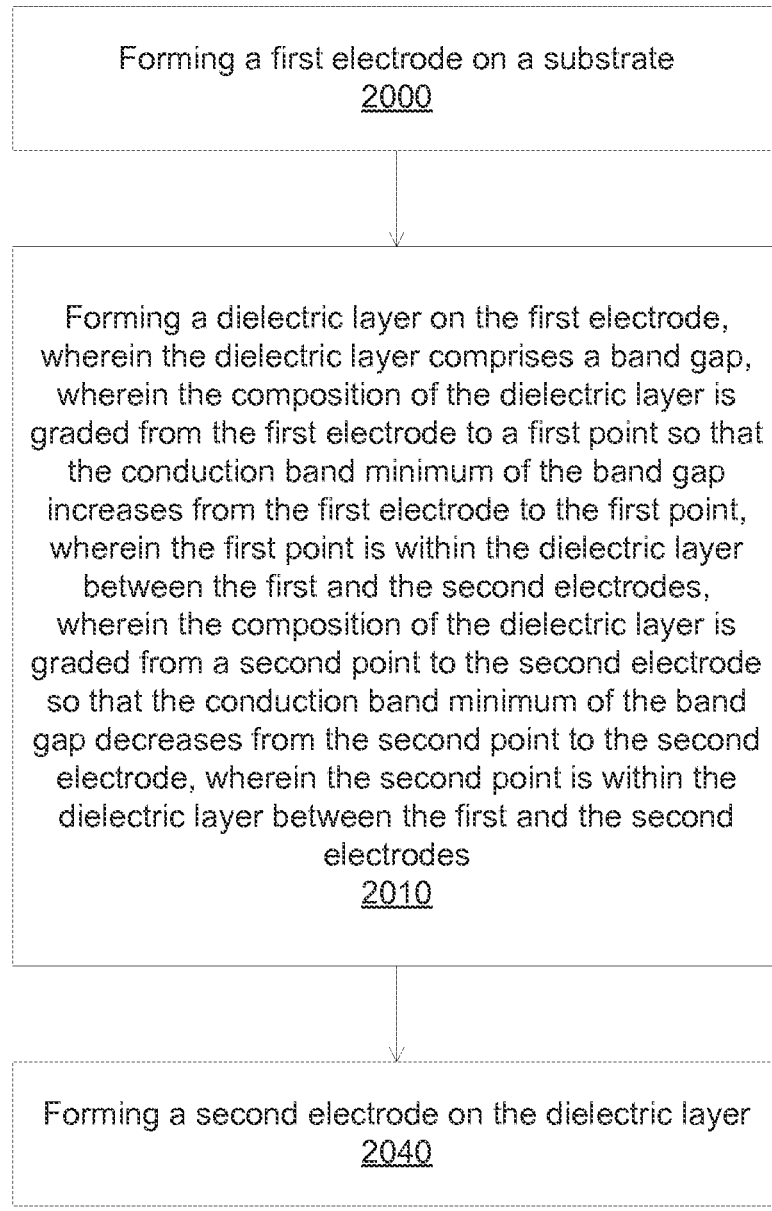
FIG. 20 illustrates a flowchart for forming a current selector according to some embodiments.

FIG. 20 illustrates a flowchart for forming a steering element according to some embodiments. In operation 2000, a first electrode layer is formed. The first electrode layer can be formed on a substrate, for example, a silicon substrate that may include one or more layers already formed thereon. In operation 2010, a dielectric layer can be formed on the first electrode. The dielectric layer can be operable as a steering element, having a composition profile that increases from the first electrode to a first point within the dielectric layer. The increased composition profile can be linear or non-linear, e.g., a straight line, multiple straight line segments, a curved line, multiple curved lines, or any combination thereof. The composition profile can decrease from a second point within the dielectric layer to an opposite electrode. The decreased composition profile can be linear or non-linear, e.g., a straight line, multiple straight line segments, a curved line, multiple curved lines, or any combination thereof. The two points can coincide, or can be separated, with a linear or non-linear profile between these two points. An optional treatment, e.g., an oxidation anneal, can be performed after the first dielectric layer. In operation 2020, a second electrode layer is formed on the steering element stack.

Although the foregoing examples have been described in some detail for purposes of clarity of understanding, the invention is not limited to the details provided. There are many alternative ways of implementing the invention. The disclosed examples are illustrative and not restrictive.

What is claimed is:
1. A steering element comprising
a first electrode;
a second electrode; and
a dielectric layer disposed between the first and the second electrodes,
wherein the dielectric layer has a conduction band and a valence band and a band gap between the conduction band and the valence band,
wherein the conduction band has a conduction band minimum energy level,
wherein the conduction band minimum energy level increases from the first electrode to a first point positioned within the dielectric layer,
wherein the conduction band minimum energy level decreases from a second point positioned with the dielectric layer to the second electrode, and
wherein the dielectric layer comprises a first set of elements and a second set of elements,
wherein the first set of elements comprises strontium (Sr) and titanium (Ti) and wherein a ratio of strontium to titanium in the first set of elements is constant throughout the dielectric layer,
wherein the second set of elements comprises barium (Ba) and zirconium (Zr) and wherein a ratio of barium to zirconium in the second set of elements is constant throughout the dielectric layer,
wherein a ratio of the first set of elements to the second set varies from the first electrode to the first point causing the conduction band minimum energy level to increase from the first electrode to the first point, and
wherein a ratio of the first set of elements to the second set varies from the second electrode to the second point causing the conduction band minimum energy level to decrease from the second point to the second electrode.

2. A steering element as in claim 1 wherein the first point coincides with the second point.

3. A steering element as in claim 1 wherein the first point coincides with the second point and is located at a mid-point of the dielectric layer.

4. A steering element as in claim 1 wherein the conduction band minimum energy level varies gradually from the first electrode to the first point or varies gradually from the second point to the second electrode.

5. A steering element as in claim 1 wherein a work function of the first or second electrode is configured to suppress tunneling and thermionic current in an off-state of the steering element, or
wherein the work function of the first or second electrode is configured to maximize a ratio of the tunneling and thermionic currents in an on-state and in an off-state of the steering element,
wherein the off-state is characterized by an off-voltage applied between the first and second electrodes, wherein the on-state is characterized by an on-voltage applied between the first and second electrodes,
wherein the off-state voltage is half of the on-state voltage.

6. A steering element as in claim 1 wherein slopes of the conduction band minimum energy level are configured to suppress tunneling and thermionic current in an off-state of the steering element, or
wherein the slopes of the conduction band minimum energy level are configured to maximize a ratio of the tunneling and thermionic currents in an on-state and in an off-state of the steering element,
wherein the off-state is characterized by an off-voltage applied between the first and second electrodes, wherein the on-state is characterized by an on-voltage applied between the first and second electrodes, wherein the off-state voltage is half of the on-state voltage.

7. A steering element as in claim 1 wherein a thickness of the dielectric layer is between 3 and 10 nm.

8. A steering element as in claim 1 wherein the first point does not coincide with the second point.

9. A steering element as in claim 1 wherein a composition of the dielectric layer is represented by $(SrTi)_x(BaZr)_{1-x}O_3$, wherein x is between 0.8 and 1 in a portion of the dielectric layer interfacing at least one of the first electrode and the second electrode, and wherein x is between 0 and 0.2 at the first point or the second point.

10. A method to form a steering element, the method comprising forming a first electrode and a second electrode; and
forming a graded dielectric layer between the first electrode and the second electrode,
wherein the dielectric layer has a conduction band and a valence band and a band gap between the conduction band and the valence band,
wherein the conduction band has a conduction band minimum energy level,
wherein the conduction band minimum energy level increases from the first electrode to a first point positioned within the dielectric layer,
wherein the conduction band minimum energy level decreases from a second point positioned with the dielectric layer to the second electrode, and
wherein the dielectric layer comprises a first set of elements and a second set of elements, wherein the first set of elements comprises strontium (Sr) and titanium (Ti) and wherein a ratio of strontium to titanium in the first set of elements is constant throughout the dielectric layer, wherein the second set of elements comprises barium (Ba) and zirconium (Zr) and wherein a ratio of barium to zirconium in the second set of elements is constant throughout the dielectric layer, wherein a ratio of the first set of elements to the second set varies from the first electrode to the first point causing the conduction band minimum energy level to increase from the first electrode to the first point, and wherein a ratio of the first set of elements to the second set varies from the second electrode to the second point causing the conduction band minimum energy level to decrease from the second point to the second electrode.

11. A method as in claim 10 wherein the first point coincides with the second point and located at a mid-point of the dielectric layer.

12. A method as in claim 10 wherein the conduction band minimum is symmetric, and wherein work functions of the first and second electrodes are the same.

13. A method as in claim 10 wherein the composition of the dielectric layer varies gradually from the first electrode to the first point or varies gradually from the second point to the second electrode.

14. A method as in claim 10
wherein a work function of the first or second electrode is configured to suppress tunneling and thermionic current in an off-state of the steering element, or wherein the work function of the first or second electrode is configured to maximize a ratio of the tunneling and thermionic currents in an on-state and in an off-state of the steering element, wherein the off-state is characterized by an off-voltage applied between the first and second electrodes, wherein the on-state is characterized by an on-voltage applied between the first and second electrodes, wherein the off-state voltage is half of the on-state voltage.

15. A method as in claim 10
wherein slopes of the conduction band minimum energy level are configured to suppress tunneling and thermionic current in an off-state of the steering element, or wherein the slopes of the conduction band minimum energy level are configured to maximize a ratio of the tunneling and thermionic currents in an on-state and in an off-state of the steering element, wherein the off-state is characterized by an off-voltage applied between the first and second electrodes, wherein the on-state is characterized by an on-voltage applied between the first and second electrodes, wherein the off-state voltage is half of the on-state voltage.

\* \* \* \* \*